United States Patent
Nishi et al.

(10) Patent No.: US 8,487,362 B2
(45) Date of Patent: Jul. 16, 2013

(54) SEMICONDUCTOR DEVICE AND METHOD OF FORMING THE SAME

(71) Applicant: Elipda Memory, Inc., Tokyo (JP)

(72) Inventors: Hiro Nishi, Tokyo (JP); Eiichirou Kakehashi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/715,692

(22) Filed: Dec. 14, 2012

(65) Prior Publication Data

US 2013/0126963 A1 May 23, 2013

Related U.S. Application Data

(63) Continuation of application No. 12/662,958, filed on May 13, 2010, now Pat. No. 8,343,832.

(30) Foreign Application Priority Data

May 14, 2009 (JP) .................. 2009-117951

(51) Int. Cl.
*H01L 29/94* (2006.01)
(52) U.S. Cl.
USPC ...... 257/302; 257/328; 257/329; 257/E29.26; 257/E29.131; 257/E29.183
(58) Field of Classification Search
USPC ............. 438/137, 138, 173, 197, 206, 209, 438/212, 268; 257/302, 328, 329, E27.096, 257/E29.26, E29, 131, E29.183, E29.262, 257/E29.274, E21.629
See application file for complete search history.

(56) References Cited

U.S. PATENT DOCUMENTS

| | | | |
|---|---|---|---|
| 6,337,497 B1 * | 1/2002 | Hanafi et al. | 257/306 |
| 7,259,415 B1 * | 8/2007 | Forbes | 257/301 |
| 2007/0158719 A1 | 7/2007 | Wang | |
| 2007/0158764 A1 * | 7/2007 | Orlowski et al. | 257/401 |
| 2008/0296659 A1 | 12/2008 | Park et al. | |
| 2009/0061583 A1 | 3/2009 | Wang | |

* cited by examiner

*Primary Examiner* — Brook Kebede
(74) *Attorney, Agent, or Firm* — McGinn IP Law Group, PLLC

(57) ABSTRACT

A semiconductor device includes a semiconductor substrate having first and second regions, a first pillar transistor, and a second pillar transistor, wherein the first pillar transistor comprises a first semiconductor pillar disposed in the first region, and a first gate electrode covering a side surface of the first semiconductor pillar, wherein the second pillar transistor comprises a second semiconductor pillar disposed in the second region, and a second gate electrode covering a side surface of the second semiconductor pillar, wherein the first gate electrode is different in height from the second gate electrode, and the first and second pillar transistors form a CMOS device.

16 Claims, 16 Drawing Sheets

SEMICONDUCTOR DEVICE AND METHOD OF FORMING THE SAME

The present application is a Continuation Application of U.S. patent application Ser. No. 12/662,958, filed on May 13, 2010, which is based on and claims priority from Japanese patent application No. 2009-117951, filed on May 14, 2009, the entire contents of which is incorporated herein by reference.

BACKGROUND OF THE INVENTION

1. Field of the Invention

The present invention generally relates to a semiconductor device and a method of forming the same.

2. Description of the Related Art

Semiconductor integrated circuits have been on the increase in density of integration and on the improvement in performance. As the density of integration of the semiconductor integrated circuit is increased, the area shared by a transistor is reduced and the gate length of the transistor is also reduced. Reduction of the gate length will generally cause short channel effects. In order to prevent the short channel effects, it is difficult to further shrink the semiconductor integrated circuit. In order to solve these issues, a pillar MOS transistor was developed. The pillar MOS transistor includes a semiconductor pillar having a side face on which a gate insulating film is formed. The pillar MOS transistor includes a gate electrode on the gate insulating film. The gate electrode is separated by the gate insulating film from the semiconductor pillar. The pillar MOS transistor includes source and drain which are placed near the top and bottom portions of the semiconductor pillar. The pillar MOS transistor includes a channel which extends along the side face of the semiconductor pillar. The channel length direction is vertical to the surface of a semiconductor substrate. It is possible to increase the channel length without increasing the shared area of the transistor. The pillar structure allows further shrinkage of the semiconductor integrated circuit, while suppressing the short channel effects.

SUMMARY

In one embodiment, a method of forming a semiconductor device may include, but is not limited to, includes the following processes. A first pillar and a second pillar are formed on a semiconductor substrate. A semiconductor film is formed which includes first and second portions. The first portion is disposed over a side surface of the first pillar. The second portion is disposed over a side surface of the second pillar. The first and second portions are different from each other in at least one of impurity conductivity type and impurity concentration. A part of the semiconductor film is removed by etching back. The first and second portions are etched at first and second etching rates that are different from each other.

In another embodiment, a method of forming a semiconductor device may include, but is not limited to, the following processes. First and second pillars which extend in the direction are formed on a substrate. A semiconductor film is formed, which includes, but is not limited to, first and second portions. The first and second portions cover the first and second pillars, respectively. The first and second portions are different from each other in at least one of impurity conductivity type and impurity concentration. A part of the semiconductor film is removed by etching back. The first and second portions are etched at first and second etching rates that are different from each other. The first and second portions are etched to form first and second remaining portions that extend along first and second side surfaces of the first and second pillars. The first and second remaining portions are different in height from each other.

In still another embodiment, a method of forming a semiconductor device may include, but not limited to, the following process. First and second silicon pillars which extend in the direction are formed on a silicon substrate. First and second gate insulating films are formed, which cover first and second side faces of the first and second silicon pillars. A silicon film is formed, which includes, but is not limited to, first and second silicon portions. The first and second silicon portions cover the first and second silicon pillars with the first and second gate insulating films, respectively. The first and second portions are different from each other in at least one of impurity conductivity type and impurity concentration. A part of the silicon film is removed by etching back. The first and second silicon portions are etched at first and second etching rates that are different from each other. The first and second silicon portions are etched to form first and second gate electrodes that extend along the first and second gate insulating films. The first and second gate electrodes are different in height from each other. First lower and upper diffusion regions and second lower and upper diffusion regions are formed, after removing the part of the silicon film.

In yet another embodiment, a semiconductor device may include, but is not limited to, a substrate; first and second pillars over the substrate; and first and second gate electrodes extending along first and second side surfaces of the first and second pillars. The first and second gate electrodes are different in height.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
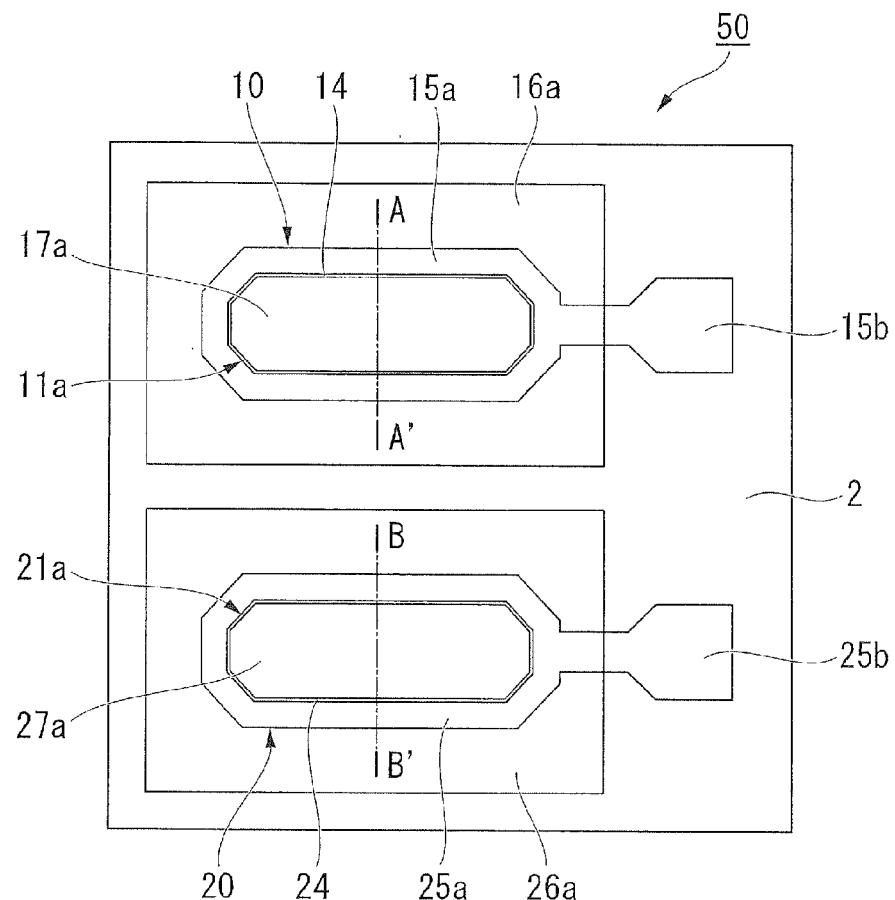
FIG. 1 is a fragmentary plan view illustrating a semiconductor device in accordance with a first preferred embodiment of the present invention.

Before describing the present invention, the related art will be explained, in order to facilitate the understanding of the present invention.

In some cases, a pillar MOS transistor can be formed as follows. A silicon substrate is selectively etched to form silicon pillars. Gate insulating films are formed on the side faces of the silicon pillars. $n^+$-type polysilicon films are formed on the gate insulating films. The polysilicon films are etched back to form gate electrodes. The gate electrodes are separated by the gate insulating films from the silicon pillars. The gate electrodes extend along the side faces of the silicon pillars. As is selectively introduced into a p-MOS region to form source and drain near the top and bottom of the silicon pillar. B is selectively introduced into an n-MOS region to form source and drain near the top and bottom of the silicon pillar. The channel is formed along the side face of the silicon pillar. The gate electrode surrounds the silicon pillar. The source and drain are formed near the top and the bottom of the silicon pillar.

Reducing the gate length of the MOS transistor will improve the high speed performance of the MOS transistor. The MOS transistor with a reduced gate length will generally have high driving capability and large leakage of current as well as have large variation in performance. It is necessary to select an optimum gate length for each of MOS transistors in a semiconductor integrated circuit. The selection is made taking into account the necessary high speed performances, the necessary reduction to the power consumption and the necessary accuracy.

In accordance with the above described method, at the time the polysilicon film is etched back, the gate electrodes have a uniform gate length.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

In one embodiment, a method of forming a semiconductor device includes the following processes. A first pillar and a second pillar are formed on a semiconductor substrate. A semiconductor film is formed which includes first and second portions. The first portion is disposed over a side surface of the first pillar. The second portion is disposed over a side surface of the second pillar. The first and second portions are different from each other in at least one of impurity conductivity type and impurity concentration. A part of the semiconductor film is removed by etching back. The first and second portions are etched at first and second etching rates that are different from each other.

In some cases, the first and second portions may be etched to form first and second remaining portions that are different from each other in a dimension. The dimension is defined in a direction in which the semiconductor film is removed.

In some cases, the first and second portions may extend in the direction. The dimension is height. The first and second remaining portions are different in height from each other.

In some cases, the method may further include, but is not limited to, forming an insulating film which covers the side surfaces of the first and second pillars. The first portion is disposed facing to the side surface of the first pillar with an intervention of the insulating film therebetween. The second portion is disposed facing to the side surface of the second pillar with an intervention of the insulating film therebetween.

In some cases, the first and second pillars are formed by etching a part of the semiconductor substrate. The first and second pillars have the same height from a remaining surface of the semiconductor substrate.

In some cases, the method may further include, but is not limited to, forming first lower and upper diffusion regions and second lower and upper diffusion regions for the first and second pillars respectively, after removing the part of the semiconductor film.

In some cases, the first and second remaining portions may be first and second gate electrodes of MOS transistors.

In some cases, removing the part of the semiconductor film is carried out by using a chlorine-containing gas.

In some cases, the semiconductor film may include, but is not limited to, silicon.

In some cases, one of the first and second portions may be doped with one of first and second conductivity type impurities and the other of the first and second portions may be non-doped.

In some cases, the first and second portions may be doped with first and second conductivity type impurities, respectively.

In some cases, the first and second portions may be different in impurity concentration.

In another embodiment, a method of forming a semiconductor device may include, but is not limited to, the following processes. First and second pillars which extend in the direction are formed on a substrate. A semiconductor film is formed, which includes, but is not limited to, first and second portions. The first and second portions cover the first and second pillars, respectively. The first and second portions are different from each other in at least one of impurity conductivity type and impurity concentration. A part of the semiconductor film is removed by etching back. The first and second portions are etched at first and second etching rates that are different from each other. The first and second portions are etched to form first and second remaining portions that extend along first and second side surfaces of the first and second pillars. The first and second remaining portions are different in height from each other.

In some cases, the method may further include, but is not limited to, forming first lower and upper diffusion regions and second lower and upper diffusion regions, after removing the part of the semiconductor film. The first and second lower diffusion regions are formed near bottoms of the first and second pillars, respectively. The first and second upper diffusion regions are formed at top portions of the first and second pillars, respectively.

In some cases, removing the part of the semiconductor film may be carried out by using a chlorine-containing gas.

In some cases, one of the first and second portions may be doped with one of first and second conductivity type impurities and the other of the first and second portions may be non-doped.

In some cases, the first and second portions may be doped with first and second conductivity type impurities, respectively.

In some cases, the first and second portions may be different in impurity concentration.

In still another embodiment, a method of forming a semiconductor device may include, but not limited to, the following process. First and second silicon pillars which extend in the direction are formed on a silicon substrate. First and second gate insulating films are formed, which cover first and second side faces of the first and second silicon pillars. A silicon film is formed, which includes, but is not limited to, first and second silicon portions. The first and second silicon portions cover the first and second silicon pillars with the first and second gate insulating films, respectively. The first and second portions are different from each other in at least one of impurity conductivity type and impurity concentration. A part of the silicon film is removed by etching back. The first and second silicon portions are etched at first and second etching rates that are different from each other. The first and second silicon portions are etched to form first and second gate electrodes that extend along the first and second gate insulating films. The first and second gate electrodes are different in height from each other. First lower and upper diffusion regions and second lower and upper diffusion regions are formed, after removing the part of the silicon film.

In some cases, removing the part of the silicon film may be carried out by using a chlorine-containing gas.

In yet another embodiment, a semiconductor device may include, but is not limited to, a substrate; first and second pillars over the substrate; and first and second gate electrodes extending along first and second side surfaces of the first and second pillars. The first and second gate electrodes are different in height.

Typically, but optionally, the first and second gate electrodes may be different in at least one of impurity conductivity type and impurity concentration.

In some cases, the first and second gate electrodes may include an n-type impurity doped silicon and a p-type impurity doped silicon. The first gate electrode may be lower in height than the second gate electrode.

In some cases, the first and second gate electrodes may include an n-type impurity doped silicon and a non-doped silicon. The first gate electrode may be lower in height than the second gate electrode.

In some cases, the first and second gate electrodes may include a non-doped silicon and a p-type impurity doped silicon. The first gate electrode may be lower in height than the second gate electrode.

In some cases, the first gate electrode may be higher in n-type impurity concentration than the second gate electrode and the first gate electrode may be lower in height than the second gate electrode.

In some cases, the first gate electrode may be lower in p-type impurity concentration than the second gate electrode and the first gate electrode may be lower in height than the second gate electrode.

In some cases, the semiconductor device may further include, but is not limited to, first and second gate insulating films which separate the first and second pillars from the first and second gate electrodes, respectively.

In some cases, the semiconductor device may further include, but is not limited to, first and second lower diffusion regions near bottoms of the first and second pillars, respectively; and first and second upper diffusion regions at top portions of the first and second pillars, respectively, In some cases, the first and second pillars may have the same height.

First Embodiment

Figure 2:
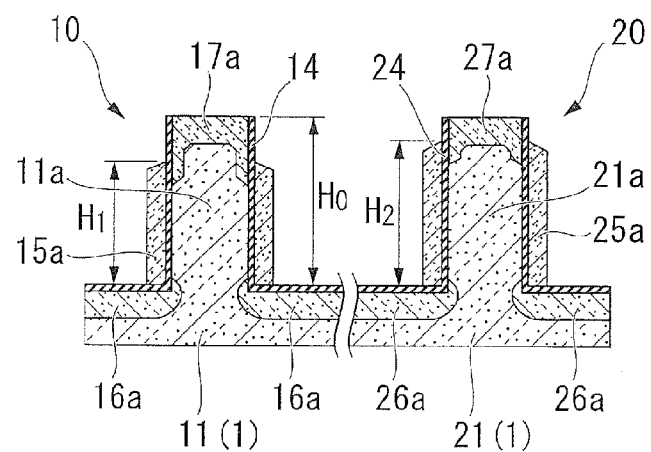
FIG. 2 is a fragmentary cross sectional elevation view illustrating the semiconductor device, taken along an A-A' line and a B-B' line of FIG. 1.

With reference to FIGS. 1 and 2, a semiconductor device 50 may include, but is not limited to, a first pillar MOS transistor 10 and a second pillar MOS transistor 20. each of the first and second pillar MOS transistors 10 and 20 may be, but not limited to, the same conductivity type transistor such as a p-type transistor. The first and second pillar MOS transistors 10 and 20 may be formed over a semiconductor substrate 1. The semiconductor substrate 1 may be a silicon substrate 10.

The first pillar MOS transistor 10 may include a first pillar 11a which extends from the semiconductor substrate 1. The first pillar 11a may extend in a vertical direction to the surface of the semiconductor substrate 1. The first pillar MOS transistor 10 may include a gate insulating film 14. The gate insulating film 14 is disposed on the side face of the first pillar 11a. The first pillar MOS transistor 10 may include a first gate electrode 15a. The first gate electrode 15a is disposed on the gate insulating film 14. The first gate electrode 15a is separated by the gate insulating film 14 from the first pillar 11a. The first gate electrode 15a surrounds the first pillar 11a. The first gate electrode 15a has a first height H1 which is defined by a dimension of the first gate electrode 15a in the vertical direction. The first pillar MOS transistor 10 may include a first lower diffusion region 16a. The first lower diffusion region 16a may serve as one of source and drain regions. The first lower diffusion region 16a is disposed in an upper region of the semiconductor substrate 1. The first lower diffusion region 16a is positioned near the bottom of the first pillar 11a. The first pillar MOS transistor 10 may include a first upper diffusion region 17a. The first upper diffusion region 17a may serve as the other of source and drain regions. The first upper diffusion region 17a is disposed at the upper portion of the first pillar 11a. The side face of the first pillar 11a serves as a channel region.

The second pillar MOS transistor 20 may include a second pillar 21a which extends from the semiconductor substrate 1. The second pillar 21a may extend in a vertical direction to the surface of the semiconductor substrate 1. The second pillar MOS transistor 20 may include a gate insulating film 24. The gate insulating film 24 is disposed on the side face of the second pillar 21a. The second pillar MOS transistor 20 may include a second gate electrode 25a. The second gate electrode 25a is disposed on the gate insulating film 24. The first gate electrode 15a is separated by the gate insulating film 24 from the second pillar 21a. The second gate electrode 25a surrounds the second pillar 21a. The second gate electrode 25a has a second height H2 which is defined by a dimension of the second gate electrode 25a in the vertical direction. The second height H2 is different from the first height H1. The second height H2 is higher from the first height H1. The second pillar MOS transistor 20 may include a second lower diffusion region 26a. The second lower diffusion region 26a may serve as one of source and drain regions. The second lower diffusion region 26a is disposed in an upper region of the semiconductor substrate 1. The second lower diffusion region 26a is positioned near the bottom of the second pillar 21a. The second pillar MOS transistor 20 may include a second upper diffusion region 27a. The second upper diffusion region 27a may serve as the other of source and drain regions. The second upper diffusion region 27a is disposed at the upper portion of the second pillar 21a. The side face of the second pillar 21a serves as a channel region.

The first and second pillars 11a and 21a have the same pillar height H0. The first gate electrode 15a has the first height H1 which is lower than the pillar height H0. The first height H1 is also lower than the second height H2. The second gate electrode 25a has the second height H2 which is lower than the pillar height H0. The second height H2 is higher from the first height H1.

The semiconductor device 50 may include an isolation region 2 which isolates active regions including first and second active regions. The first pillar MOS transistor 10 with the first pillar 11a is disposed in the first active region. The second pillar MOS transistor 20 with the second pillar 21a is disposed in the second active region. The first and second pillars 11a and 21a have substantially the same height H0.

In some cases, the semiconductor substrate 1 and the first and second pillars 11a and 21a may be made of silicon. The semiconductor substrate 1 may have first and second n-well regions 11 and 21. The first pillar 11a is disposed in the first n-well region 11. The second pillar 21a is disposed in the second n-well region 21.

The semiconductor substrate 1 and the first and second pillars 11a and 21a may be made of other semiconductor than silicon. In other cases, the semiconductor substrate 1 and the first and second pillars 11a and 21a may be made of germanium. In other cases, the semiconductor substrate 1 and the first and second pillars 11a and 21a may be made of silicon germanium. In other cases, the semiconductor substrate 1 may be an SOI substrate.

The gate insulating film 14 covers the surface of the n-well region 11. The gate insulating film 14 also covers the side face of the first pillar 11a. The gate insulating film 24 covers the surface of the n-well region 21. The gate insulating film 24 also covers the side face of the second pillar 21a.

The gate insulating films 14 and 24 may be made of an insulating material. In some cases, the gate insulating films 14 and 24 may be silicon oxide films which can be formed by a thermal oxidation method. The gate insulating films 14 and 24 may have a thickness of 6 nm. In other cases, the gate insulating films 14 and 24 may be silicon oxynitride films. In other cases, the gate insulating films 14 and 24 may be made of refractory metal oxide. In some cases, the gate insulating films 14 and 24 may be hafnium silicate oxynitride films. In other cases, the gate insulating films 14 and 24 may be hafnium dioxide films.

The first gate electrode 15a surrounds the first pillar 11a. The first gate electrode 15a is separated by the gate insulating film 14 from the first pillar 11a. The first gate electrode 15a is connected to a gate line 15b which runs over the isolation film 2. The second gate electrode 25a surrounds the second pillar 21a. The second gate electrode 25a is separated by the gate insulating film 24 from the second pillar 21a. The second gate electrode 25a is connected to a gate line 25b which runs over the isolation film 2.

Each of the first and second gate electrodes 15a and 25a may be made of a doped polysilicon. Each of the first and second gate electrodes 15a and 25a may be a doped polysilicon film which is formed by a CVD method and by doping an impurity into the polysilicon film. Each of the first and second gate electrodes 15a and 25a may have a thickness of, but not limited to, about 20 nm.

The first and second gate electrodes 15a and 25a may be different from each other in at least one of conductivity type and net impurity concentration. In some cases, the first and second gate electrodes 15a and 25a may be p-type, and the first gate electrode 15a is higher in p-type net impurity concentration than the second gate electrode 25a. In other cases, the first and second gate electrodes 15a and 25a may be p-type, and the first gate electrode 15a is lower in p-type net impurity concentration than the second gate electrode 25a. In some cases, the first and second gate electrodes 15a and 25a may be n-type, and the first gate electrode 15a is higher in n-type net impurity concentration than the second gate electrode 25a. In some cases, the first and second gate electrodes 15a and 25a may be n-type, and the first gate electrode 15a is lower in n-type net impurity concentration than the second gate electrode 25a. In some cases, the first and second gate electrodes 15a and 25a may be n-type and p-type, respectively. In other cases, the first and second gate electrodes 15a and 25a may be p-type and n-type, respectively.

In this embodiment, the first and second gate electrodes 15a and 25a are p-type, and the first gate electrode 15a is lower in p-type net impurity concentration than the second gate electrode 25a.

The first gate electrode 15a has the first height H1 which is lower than the pillar height H0. The first height H1 is also lower than the second height H2. The second gate electrode 25a has the second height H2 which is lower than the pillar height H0. The second height H2 is higher from the first height H1.

There is a first distance H0-H1 between the top of the first pillar 11a and the top of the first gate e3lectrode 15a. The first distance H0-H1 depends on the first height H1 of the first gate electrode 15a. The first distance H0-H1 is given by a difference of the first height H1 from the pillar height H0.

There is a second distance H0-H2 between the top of the second pillar 21a and the top of the second gate e3lectrode 25a. The second distance H0-H2 depends on the second height H2 of the second gate electrode 25a. The second distance H0-H2 is given by a difference of the second height H2 from the pillar height H0.

The first lower diffusion region 16a is disposed in a shallow region of the first n-well region 11 of the silicon substrate 1. The first lower diffusion region 16a may be a p-type diffusion region. The first upper diffusion region 17a is disposed in a top region of the first pillar 11a. The first upper diffusion region 17a may be a p-type diffusion region.

The second lower diffusion region 26a is disposed in a shallow region of the second n-well region 21 of the silicon substrate 1. The second lower diffusion region 26a may be a p-type diffusion region. The second upper diffusion region 27a is disposed in a top region of the second pillar 21a. The second upper diffusion region 27a may be a p-type diffusion region.

For the first pillar MOS transistor 10, the first lower diffusion region 16a and the first upper diffusion region 17a serve as source and drain regions. The side face of the first pillar 11a between the first lower diffusion region 16a and the first upper diffusion region 17a serves as a channel between the source and drain regions.

For the second pillar MOS transistor 20, the second lower diffusion region 26a and the second upper diffusion region 27a serve as source and drain regions. The side face of the second pillar 21a between the second lower diffusion region 26a and the second upper diffusion region 27a serves as a channel between the source and drain regions.

A method of forming the semiconductor device 50 shown in FIGS. 1 and 2 will be described with reference to FIGS. 3A through 3F. In FIGS. 3A through 3F, the left half shows the structure taken along an A-A' line, and the right half shows the structure taken along a B-B' line.

The method of forming the semiconductor device 50 may include, but is not limited to, a process for forming pillars, a process for forming gate semiconductor films, a process for forming gate electrodes, a process for forming lower diffusion regions, and a process for forming upper diffusion regions.

The process for forming pillars may be a process for forming first and second pillars over the semiconductor substrate 1. The process for forming gate semiconductor films may be a process for forming first and second gate semiconductor films which surround the first and second pillars, respectively. The first and second gate semiconductor films are different from each other in at least one of conductivity type and impurity concentration. The process for forming gate electrodes may be a process for forming first and second gate electrodes surrounding the first and second pillars, respectively, wherein the first and second gate electrodes are different in height from each other. The first and second gate electrodes are formed by etching back the first and second gate semiconductor films. The process for forming lower diffusion regions may be a process for forming first and second lower diffusion regions in shallow regions of the semiconductor substrate, wherein the first and second lower diffusion regions are disposed near the first and second pillars, respectively. The process for forming upper diffusion regions may be a process for forming first and second upper diffusion regions at upper portions of the first and second pillars, respectively.

(Process for Forming Pillars)

First and second pillars are formed over a semiconductor substrate. An isolation region is formed in a silicon substrate 1 to form active regions in the silicon substrate 1. An impurity of n-type is introduced into the active regions to form first and second n-well regions 11 and 21. The impurity of n-type may be P.

First and second mask films 13 and 23 are selectively formed over the silicon substrate 1. The first and second mask films 13 and 23 may have a thickness of, but not limited to, about 20 μm. The first and second mask films 13 and 23 may be made of a material which has a lower etching rate than silicon. In some cases, the first and second mask films 13 and 23 may be made of silicon nitride. In other cases, the first and second mask films 13 and 23 may be made of silicon oxide.

Figure 3A:
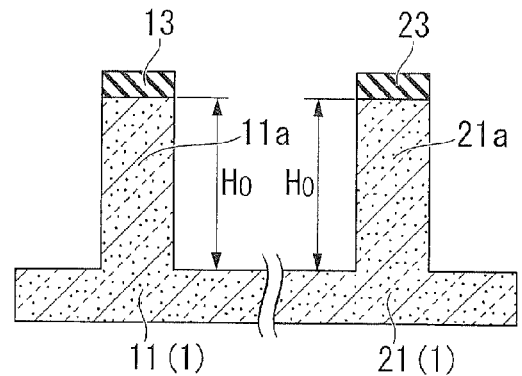
FIG. 3A is a fragmentary cross sectional elevation view illustrating a semiconductor device in a step involved in a method of forming the semiconductor device of FIGS. 1 and 2 in accordance with the first preferred embodiment of the present invention.

With reference to FIG. 3A, a lithography process and a dry etching process are carried out to form first and second masks 13 and 23 in the first and second n-well regions 11 and 21, respectively. A selective etching process is carried out by using the first and second masks 13 and 23 as masks to selectively etch the silicon substrate 1, thereby forming first and second pillars 11a and 21a in the first and second n-well regions 11 and 21, respectively. The first and second masks 13 and 23 cover the first and second pillars 11a and 21a, respectively. The first and second pillars 11a and 21a are silicon pillars. First and second pillar structures are formed. The first pillar structure includes the first pillar 11a and the first mask 13. The second pillar structure includes the second pillar 21a and the second mask 23.

The first and second pillar structures have island-shape in plan view. The first and second pillars 11a and 21a have the same pillar height H0. The pillar height H0 may be, but is not limited to, about 160 nm.

(Process for Forming Gate Semiconductor Films)

First and second gate semiconductor films are formed, which surround the first and second pillars, respectively and cover the first and second n-well regions 11 and 21, respectively.

Figure 3B:
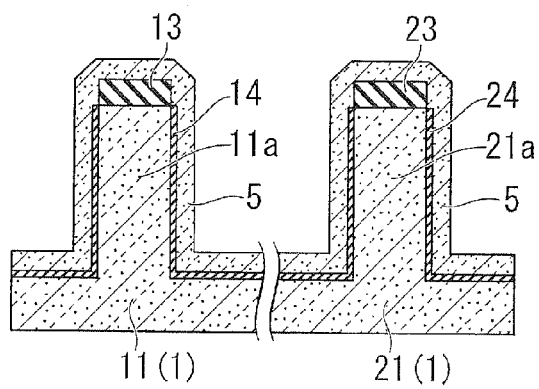
FIG. 3B is a fragmentary cross sectional elevation view illustrating a semiconductor device in a step, subsequent to the step of FIG. 3A, involved in the method of forming the semiconductor device of FIGS. 1 and 2 in accordance with the first preferred embodiment of the present invention.

With reference to FIG. 3B, gate insulating films 14 and 24 are formed which covers side faces of the first and second pillars 11a and 21a and also covers the surface of the silicon substrate 1. The gate insulating films 14 and 24 may be silicon oxide films which are formed by a thermal oxidation method. The gate insulating films 14 and 24 may have a thickness of, but not limited to, 6 nm. In other cases, the gate insulating films 14 and 24 may be formed by a CVD method.

A gate semiconductor film 5 is formed which covers the first and second masks 13 and 23 and the gate insulating films 14 and 24. The gate semiconductor film 5 surrounds the first and second pillars 11a and 21a. The gate semiconductor film 5 covers the surface of the first and second n-well regions 11 and 21. The gate semiconductor film 5 may be made of non-doped silicon. The gate semiconductor film 5 may be formed by a CVD method. The gate semiconductor film 5 may have a thickness of, but not limited to, about 20 nm.

The gate semiconductor film 5 includes a first portion 15 and a second portion 25. The first portion 15 of the gate semiconductor film 5 covers the first pillar 11a. The second portion 25 of the gate semiconductor film 5 covers the second pillar 21a. The gate semiconductor film 5 is further processed so that the first portion 15 of the gate semiconductor film 5 is different in at least one of conductivity type and impurity concentration from the second portion 25 of the gate semiconductor film 5. In some cases, the first portion 15 of the gate semiconductor film 5 is non-doped silicon and the second portion 25 of the gate semiconductor film 5 is p-type silicon.

Figure 3C:
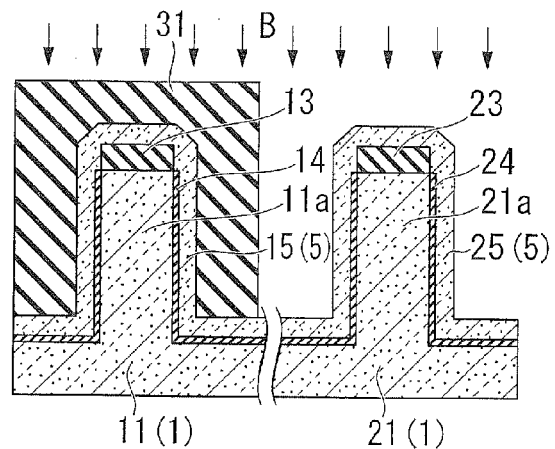
FIG. 3C is a fragmentary cross sectional elevation view illustrating a semiconductor device in a step, subsequent to the step of FIG. 3B, involved in the method of forming the semiconductor device of FIGS. 1 and 2 in accordance with the first preferred embodiment of the present invention.

With reference to FIG. 3C, a resist mask 31 is formed by a lithography process. The resist mask 31 covers the first portion 15 of the gate semiconductor film 5, wherein the first portion 15 covers the first pillar 11a. The resist mask 31 does not cover the second portion 25 of the gate semiconductor film 5, wherein the second portion 25 covers the second pillar 21a. A first impurity implantation process is carried out using the resist mask 31 to selectively introduce a p-type impurity into the second portion 25 of the gate semiconductor film 5. The first impurity implantation process can be carried out by introducing boron (B) at a dose of 1E15 atoms/cm$^2$ and at energy of 5 keV. The resist mask 31 is removed. The gate semiconductor film 5 has the first portion 15 of non-doped silicon and the second portion 25 of p-type silicon, wherein the first portion 15 covers the first pillar 11a and the second portion 25 covers the second pillar 21a.

Optionally, an anneal process may be carried out to get uniformity of impurity concentration of the gate semiconductor film 5. Increased uniformity of the impurity concentration of the gate semiconductor film 5 will improve uniformity of in-plain etching rate over wafer.

(Process for Forming Gate Electrodes)

Figure 3D:
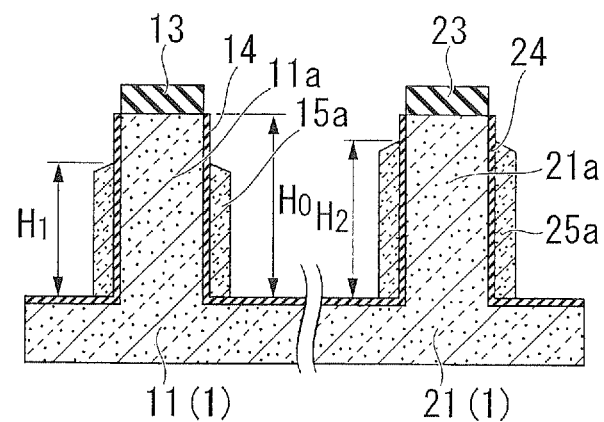
FIG. 3D is a fragmentary cross sectional elevation view illustrating a semiconductor device in a step, subsequent to the step of FIG. 3C, involved in the method of forming the semiconductor device of FIGS. 1 and 2 in accordance with the first preferred embodiment of the present invention.

With reference to FIG. 3D, the gate silicon film 5 is etched back by using a chlorine-based gas such as chlorine gas ($Cl_2$), thereby forming first and second gate electrodes 15a and 25a. The first gate electrode 15a surrounds the first pillar 11a. The first gate electrode 15a is separated by the gate insulating film 14 from the side face of the first pillar 11a. The second gate electrode 25a surrounds the second pillar 21a. The second gate electrode 25a is separated by the gate insulating film 24 from the side face of the second pillar 21a. The gate silicon film 5 is selectively removed. The etching back process is carried out to selectively remove removal portions of the gate silicon film 5, while leaving first and second remaining portions 15 and 25 of the gate silicon film 5. The removal portions have covered the surface of the silicon substrate 1 and the first and second masks 13 and 23. The first and second remaining portions 15 and 25 surround the first and second pillars 11a and 21a, respectively. As a result of the selective removal process, the first and second gate electrodes 15a and 25a are formed, which surround the first and second pillars 11a and 21a, respectively.

The etch-back process may be carried out under the following etching conditions. An ICP etcher can be used. The vacuum pressure can be 6 mTorr. The bias power can be 75 W. The flow rate of chlorine gas (Cl2) can be 30 sccm. The etching process can be continued for 50 seconds under the above-described conditions.

With reference to FIG. 3D, as the result of the etching process, the gate silicon film 5 is made into the first and second gate electrodes 15a and 25a which have first and second gate heights H1 and H2. In some cases, the first height H1 may be, but is not limited to, 100 nm, and the second height H2 may be, but is not limited to, 140 nm. The gate silicon film 5 was selectively doped with an impurity such as B. The gate silicon film 5 had the first portion which is free of any impurity which covers the first pillar 11a. The gate silicon film 5 had the second portion which is doped any impurity such as B which covers the second pillar 21a. Of the gate silicon film 5, the B-doped remaining portion is higher in height than the undoped remaining portion. The etch back process will form the first and second gate electrodes 15a and 25a, so that the second gate electrode 25a which is doped with B is higher in height than the first gate electrode 15a which is undoped. The common etch back process will form the first and second gate electrodes 15a and 25a which are different in height because the first and second gate electrodes 15a and 25a are different in impurity concentration. Namely, the difference in impurity concentration between different portions of the same semiconductor film will allow etch back process for etching back the semiconductor film to form remaining portions with different heights. The remaining portion of higher impurity concentration is higher in height than the remaining portion of lower impurity concentration.

As a result of the etch-back process, the remaining undoped portion surrounding the side face of the first pillar 11a is lower in height than the remaining boron-doped portion surrounding the side face of the second pillar 21a. The common etch-back process can form the gate electrodes having different heights because of difference of etching rate between the undoped portion and the boron-doped portion. The etching rate of the undoped portion is faster than the etching rate of the boron-doped portion. For example, the etching rate of the boron-doped portion to which boron was doped at a dose of 1E15 atoms/cm$^2$ is 85 nm/min. The etching rate of the undoped portion is 140 nm/min. The boron-doped portion is slower in etching rate than the undoped portion.

The etching apparatus is not limited to the ICP etcher. An ECR etcher or a parallel plate plasma etching apparatus can be used.

In order to increase the etch back selecting ratio between the gate silicon film 5 and the gate insulating films 14 and 24, an oxygen ($O_2$) gas or a hydrogen bromide (HBr) can be added to the etching gas.

In some cases, the etch back process can be carried out so that at least one of the first and second gate electrodes 15a and 25a has the top which is lower than the tops of the pillars 11a and 21a. In some cases, the second gate electrode 25a has the top which is positioned above the top of the second pillar 21a, and the first gate electrode 15a has the top which is positioned below the top of the first pillar 11a. The top of the second gate electrode 25a is positioned above the bottom of the second mask 23 and below the top of the mask 23. The top of the first gate electrode 15a is positioned below the bottom of the first mask 23.

In other cases, as shown in FIG. 3D, the top of the second gate electrode 25a is positioned below the bottom of the second mask 23. The top of the first gate electrode 15a is also positioned below the bottom of the first mask 23. The top of the first gate electrode 15a is also positioned below the top of the second gate electrode 25a.

With reference back to FIG. 1, the first and second gate electrodes 15a and 25a are connected to first and second gate lines 15b and 25b, respectively. In some cases, the first and second gate lines 15b and 25b can be formed as follows. A resist mask is formed by a lithography process before the etch-back process is carried out to form the first and second gate electrodes 15a and 25a. The resist mask has a pattern for the first and second gate lines 15b and 25b. The etch-back process can be carried out to form not only the first and second gate lines 15b and 25b but also the first and second gate lines 15b and 25b.

In other cases, no gate lines can be formed. Instead, contacts can be formed in an inter-layer insulator which covers the transistors so that the contacts connect the first and second gate electrodes 15a and 25a to external lines. The contacts are in contact with the side faces of the first and second gate electrodes 15a and 25a.

(Process for Forming Lower and Upper Diffusion Regions)

The first lower diffusion region 16a is formed near the bottom of the first pillar 11a and in the n-well region 11. The first upper diffusion region 17a is formed at the upper portion of the first pillar 11a. The second lower diffusion region 26a is formed near the bottom of the second pillar 21a and in the n-well region 21. The second upper diffusion region 27a is formed at the upper portion of the second pillar 21a.

Figure 3E:
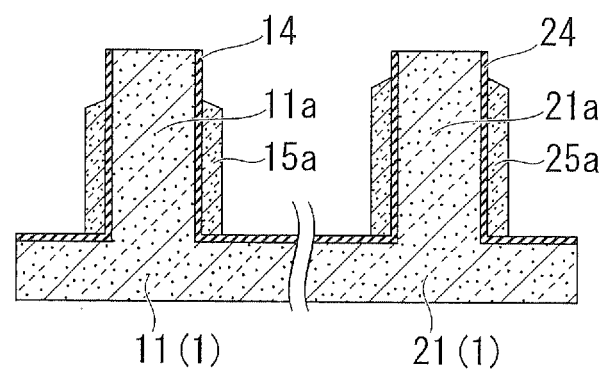
FIG. 3E is a fragmentary cross sectional elevation view illustrating a semiconductor device in a step, subsequent to the step of FIG. 3D, involved in the method of forming the semiconductor device of FIGS. 1 and 2 in accordance with the first preferred embodiment of the present invention.

With reference to FIG. 3E, the first and second masks 13 and 23 are removed. The first and second masks 13 and 23 can be removed by an etching process. The etching process has a high etching selective ratio of the first and second masks 13 and 23 to the gate electrodes 15a and 25a, the silicon substrate 1, and the gate insulating films 14 and 24. The etching process can be carried out to selectively remove the first and second masks 13 and 23. In some cases, a wet phosphorous acid solution can be used to selectively etch the first and second masks 13 and 23, while leaving the gate electrodes 15a and 25a, the silicon substrate 1, and the gate insulating films 14 and 24.

Figure 3F:
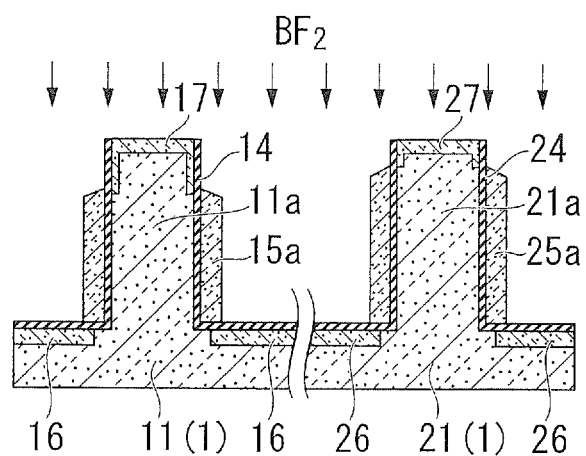
FIG. 3F is a fragmentary cross sectional elevation view illustrating a semiconductor device in a step, subsequent to the step of FIG. 3E, involved in the method of forming the semiconductor device of FIGS. 1 and 2 in accordance with the first preferred embodiment of the present invention.

With reference to FIG. 3F, an ion-implantation process can be carried out to introduce an impurity into upper portions of the first and second pillars 11a and 21a, the first and second gate electrodes 15a and 25a, and the first and second n-well regions 11 and 21. The impurity may be, but is not limited to, boron difluoride ($BF_2$). The ion-implantation process can be carried out under the following conditions. A dose is 5E15 atoms/cm$^2$. Ion-implantation energy is 15 keV. The ion-implantation process will form first and second lower diffusion regions 16 and 26 and first and second upper diffusion regions 17 and 27. The first and second lower diffusion regions 16 and 26 are self-aligned to the first and second gate electrodes 15a and 25a, respectively. The first and second lower diffusion regions 16 and 26 are formed in the first and second n-well regions 11 and 21, respectively. The first and second lower diffusion regions 16 and 26 are positioned near the bottoms of the first and second pillars 11a and 21a, respectively. The first and second upper diffusion regions 17 and 27 are formed at upper portions of the first and second pillars 11a and 21a, respectively. The first and second lower diffusion regions 16 and 26 serves as one of source and drain regions. The first and second upper diffusion regions 17 and 27 serves as the other of the source and drain regions. The ion-implantation introduces the impurity into the first and second gate electrodes 15a and 25a. The ion-implantation can introduce boron into the first and second gate electrodes 15a and 25a, so that the first and second gate electrodes 15a and 25a are p-type gate electrodes.

A heat treatment can be carried out to activate the impurity implanted in the first and second lower diffusion regions 16 and 26 and the first and second upper diffusion regions 17 and 27. The heat treatment can be carried out under the following conditions. In some cases, a rapid thermal anneal can be carried out at 900° C. for 5 minutes. In other cases, a diffusion reaction chamber can be used.

As a result, first and second pillar MOS transistors 10 and 20 are formed over the silicon substrate 1. The first pillar MOS transistor 10 includes the first pillar 11a extending vertically from the semiconductor substrate 1, the gate insulating film 14 covering the side face of the first pillar 11a, the first gate electrode 15a surrounding the first pillar 11a. The first pillar MOS transistor 10 includes the first lower diffusion region 16a near the bottom of the first pillar 11a and the first upper diffusion region 17a at the upper portion of the first pillar 11a. The side face of the first pillar 11a serves as a channel region. The second pillar MOS transistor 20 includes the second pillar 21a extending vertically from the semiconductor substrate 1, the gate insulating film 24 covering the side face of the second pillar 21a, the second gate electrode 25a surrounding the second pillar 21a. The second pillar MOS transistor 20 includes the second lower diffusion region 26a near the bottom of the second pillar 21a and the second upper diffusion region 27a at the upper portion of the second pillar 21a. The side face of the second pillar 21a serves as a channel region. The first and second pillar MOS transistors 10 and 20 have the same conductivity type because the same conductivity type impurity is importuned to form the first and second lower diffusion regions 16 and 26 and the first and second upper diffusion regions 17 and 27.

The first pillar MOS transistor 10 has a first gate length. The first gate length is defined by the sum of the first gate height H1 of the first gate electrode 15a and the side wall width of the first gate electrode 15a. The side wall width of the first gate electrode 15a is the thickness of the gate silicon film which constitutes the first gate electrode 15a. The second pillar MOS transistor 20 has a second gate length. The second gate length is defined by the sum of the second gate height H2 of the second gate electrode 25a and the side wall width of the second gate electrode 25a. The side wall width of the second gate electrode 25a is the thickness of the gate silicon film which constitutes the second gate electrode 25a. The side wall width of the first gate electrode 15a is substantially the same as the side wall width of the second gate electrode 25a. The first gate height H1 of the first gate electrode 15a is about 100 nm. The second gate height H2 of the second gate electrode 25a is about 140 nm. The first gate height H1 of the first gate electrode 15a is higher in height than the second gate height H2 of the second gate electrode 25a. The first gate length of the first pillar MOS transistor 10 is longer than the second gate length of the second pillar MOS transistor 20 by the difference between the first gate height H1 of the first gate electrode 15a and the second gate height H2 of the second gate electrode 25a. The difference in the gate length between the first and second pillar MOS transistors 10 and 20 can be adjusted by adjusting the difference in the height between the first and second gate electrodes 15a and 25a.

The first pillar MOS transistor 10 has the channel region which extends on the side face of the first pillar 11a. The second pillar MOS transistor 20 has the channel region which extends on the side face of the second pillar 21a. The first lower diffusion region 16a extends under the first gate electrode 15a. The second lower diffusion region 26a extends under the second gate electrode 25a. The channel of the first pillar MOS transistor 10 does not extend under the first gate electrode 15a. The channel of the second pillar MOS transistor 20 does not extend under the second gate electrode 25a. The channel of the first pillar MOS transistor 10 extends only along the side face of the first pillar 11a. The channel of the second pillar MOS transistor 20 extends only along the side face of the second pillar 21a.

In other cases, the channel of the first pillar MOS transistor 10 can extend under the first gate electrode 15a and the channel of the second pillar MOS transistor 20 can extend under the second gate electrode 25a. The channel can be formed under the first gate electrode 15a by increasing the thickness of the gate silicon film which constitutes the first gate electrode 15a. The channel can also be formed under the second gate electrode 25a by increasing the thickness of the gate silicon film which constitutes the second gate electrode 25a. The channel can be formed under the first gate electrode 15a by suppressing thermal diffusion of the impurity. The channel can be formed under the second gate electrode 25a by suppressing thermal diffusion of the impurity.

Figure 3G:
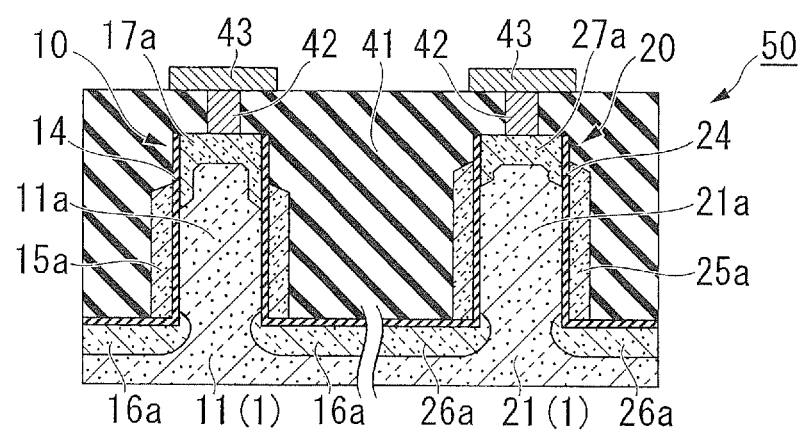
FIG. 3G is a fragmentary cross sectional elevation view illustrating a semiconductor device in a step, subsequent to the step of FIG. 3F, involved in the method of forming the semiconductor device of FIGS. 1 and 2 in accordance with the first preferred embodiment of the present invention.

With reference to FIG. 3G, an inter-layer insulator 41 is formed which covers the first and second pillar MOS transistors 10 and 20. Contact plugs 42 are formed in the inter-layer insulator 41. The contact plugs 42 contact the first upper diffusion region 17a and the second upper diffusion region 27a. Wirings 43 are formed over the inter-layer insulator 41. The wirings 43 are connected through the contact plugs 42 to the first upper diffusion region 17a and the second upper diffusion region 27a. As a result, the semiconductor device 50 including the first and second pillar MOS transistors 10 and 20 is completed.

The semiconductor device 50 includes the first and second pillar MOS transistors 10 and 20 which have the first and second gate electrodes 15a and 25a which are different in height from each other. The first and second gate electrodes 15a and 25a have the first and second tops which are different in level from each other. The first and second pillars 11a and 21a have the first and second tops which are the same in level as each other. The first and second upper diffusion regions 17a and 27a have the same top levels as each other. The channel of the first pillar MOS transistor 10 is connected through the first upper diffusion region 17a and the contact plug 42 to the wiring 43. The channel of the second pillar MOS transistor 20 is connected through the second upper diffusion region 27a and the contact plug 42 to the wiring 43.

The gate semiconductor film is selectively doped with the impurity such as boron B, so that the gate semiconductor film has the undoped portion covering the first pillar 11a and the boron-doped portion covering the second pillar 21a. The gate semiconductor film is then subjected to the etch-back process using the chlorine-based gas. As a result of the etch-back process, the remaining undoped portion surrounding the side face of the first pillar 11a is lower in height than the remaining boron-doped portion surrounding the side face of the second pillar 21a. The common etch-back process can form the gate electrodes having different heights because of difference of etching rate between the undoped portion and the boron-doped portion. The etching rate of the undoped portion is faster than the etching rate of the boron-doped portion. For example, the etching rate of the boron-doped portion to which boron was doped at a dose of 1E15 atoms/cm$^2$ is 85 nm/min. The etching rate of the undoped portion is 140 nm/min. The boron-doped portion is slower in etching rate than the undoped portion. The difference in etching rate between the doped portion and the undoped portion will cause the difference in height between the remaining doped portion and the remaining undoped portion.

As the result of the etching process, the gate silicon film 5 is made into the first and second gate electrodes 15a and 25a which have first and second gate heights H1 and H2. In some cases, the first height H1 may be, but is not limited to, 100 nm, and the second height H2 may be, but is not limited to, 140 nm.

The first and second pillars 11a and 21a have the height H0. The first and second masks 13 and 23 have the thickness Hm. The gate electrode film 5 has the thickness of Hf. A distance H is defined between the top level of the gate electrode film 5 and the surface of the semiconductor substrate 1. The distance H will be given by H=H0+Hm+Hf. The etch-back process is carried out for an etching time t. The undoped portion of the gate silicon film 5 has a first etching rate R1. The boron-doped portion of the gate silicon film 5 has a second etching rate R2. The remaining undoped portion has a first height H1. The remaining boron-doped portion has a second height H2. The first height H1 is given by H1=H−R1×t. The second height H2 is given by H2=H−R2×t. Namely, the difference between the first and second heights H1 and H2 can be adjusted by adjusting the first and second etching rates R1 and R2. The first and second heights H1 and H2 can be adjusted by adjusting the first and second etching rates R1 and R2. The first and second heights H1 and H2 can be adjusted by adjusting the height H0 of the first and second pillars 11a and 21a. The first and second heights H1 and H2 can be adjusted by adjusting the thickness Hm of the first and second masks 13 and 23. The first and second heights H1 and H2 can be adjusted by adjusting the thickness of Hf of the gate electrode film 5. The first and second heights H1 and H2 can be adjusted by adjusting the first and second etching rates R1 and R2, the height H0 of the first and second pillars 11a and 21a, the thickness Hm of the first and second masks 13 and 23, and the thickness of Hf of the gate electrode film 5.

The second gate electrode 25a is subjected to first and second impurity implantation processes. The first impurity implantation process is carried out to introduce the impurity into the gate silicon film 5 as shown in FIG. 3C. The second impurity implantation process is carried out to introduce the impurity not only into the second gate electrode 25a but also into the second upper and lower diffusion regions 26a and 27a as shown in FIG. 3F. In total, the second gate electrode 25a is introduced with boron at 6E15 atoms/cm$^2$. The first gate electrode 15a is subjected to only the second impurity implantation process. The second impurity implantation process is carried out to introduce the impurity not only into the first gate electrode 15a but also into the first upper and lower diffusion regions 16a and 17a as shown in FIG. 3F. In total, the first gate electrode 15a is introduced with boron at 5E15 atoms/cm$^2$. The second gate electrode 25a is higher in impurity concentration than the first gate electrode 15a. The first and second gate electrodes 15a and 25a are different from each other in height and impurity concentration. In order to prevent that boron from penetrating the gate insulating film to vary the threshold voltage, the heat treatment can be controlled which is to be carried out after the transistors are formed. In order to prevent that boron from penetrating the gate insulating film to vary the threshold voltage, the gate insulating film 24 can be made of silicon nitride.

The semiconductor device 50 includes the first and second pillar MOS transistors 10 and 20 which have the first and second gate electrodes 15a and 25a which are different in height from each other. The first and second pillar MOS transistors 10 and 20 are different in gate length from each other.

The impurity such as boron is selectively introduced into the gate silicon film 5 so that the gate silicon film 5 includes the undoped portion 15 and the impurity-doped portion 25, before the gate silicon film 5 is etched back using the chorine-based gas. The etch-back process etches the undoped portion 15 at a higher etching rate and the impurity-doped portion 25 at a lower etching rate. As a result of the etch-back process, the first and second gate electrodes 15a and 25a are formed so that the first gate electrode 15a is lower in height than the second gate electrode 25a. The first and second pillar MOS transistors 10 and 20 are different in gate length from each other.

Second Embodiment

A method of forming a semiconductor device in accordance with a second embodiment will be described with reference to FIGS. 4A through 4E. The second embodiment provides another method of forming a semiconductor device that includes first and second pillar MOS transistors 210 and 220 which have first and second gate electrodes 215a and 225a which are different in height from each other. The first and second pillar MOS transistors 210 and 220 are different in gate length from each other.

Figure 4A:
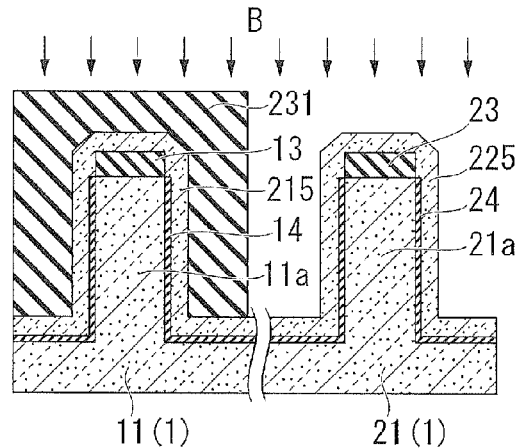
FIG. 4A is a fragmentary cross sectional elevation view illustrating a semiconductor device in a step involved in a method of forming a semiconductor device in accordance with a second preferred embodiment of the present invention.
Figure 4B:
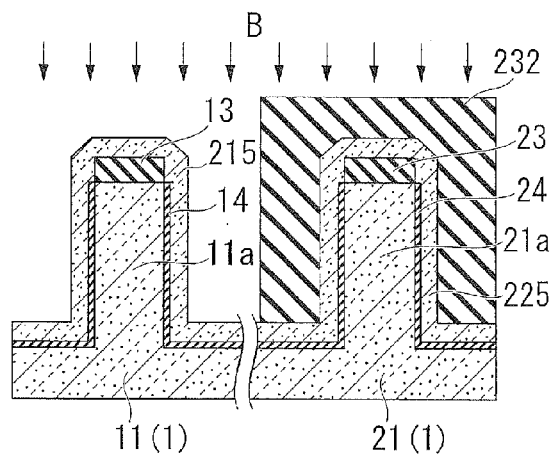
FIG. 4B is a fragmentary cross sectional elevation view illustrating a semiconductor device in a step, subsequent to the step of FIG. 4A, involved in the method of forming the semiconductor device in accordance with the second preferred embodiment of the present invention.

The method of forming the semiconductor device in accordance with the second embodiment is different from that in accordance with the first embodiment in a process shown in FIG. 4B. The same or similar steps involved in the method of this embodiment as those of the first embodiment will not be described again. The different step involved in the method of this embodiment shown in FIG. 4B is to form a gate silicon film.

The first and second pillars 11a and 21a are formed in the same processes as described with reference to FIG. 3A in the first embodiment. The first and second pillars 11a and 21a extend vertically or upwardly from the surfaces of the n-well regions 11 and 21 of the silicon substrate 1. The first and second masks 13 and 23 are formed in the same processes as described with reference to FIG. 3A in the first embodiment. The gate insulating films 14 and 24 are formed in the same processes as described with reference to FIG. 3B in the first embodiment. Then, the gate silicon film 5 is formed in the same processes as described with reference to FIG. 3B in the first embodiment. The gate silicon film 5 covers the first and second masks 13 and 23 and the gate insulating films 14 and 24. The gate semiconductor film 5 surrounds the first and second pillars 11a and 21a. The gate semiconductor film 5 covers the surface of the first and second n-well regions 11 and 21. The gate semiconductor film 5 may be made of non-doped silicon. The gate semiconductor film 5 may be formed by a CVD method. The gate semiconductor film 5 may have a thickness of, but not limited to, about 20 nm.

The gate semiconductor film 5 includes a first portion 215 and a second portion 225. The first portion 215 of the gate semiconductor film 5 covers the first pillar 11a. The second portion 225 of the gate semiconductor film 5 covers the second pillar 21a. The gate semiconductor film 5 is further processed so that the first portion 215 of the gate semiconductor film 5 is different in at least one of conductivity type and impurity concentration from the second portion 225 of the gate semiconductor film 5. In some cases, the first portion 215 of the gate semiconductor film 5 is p-type silicon and the second portion 225 of the gate semiconductor film 5 is also p-type silicon. In this case, the first portion 215 is lower in impurity concentration than the second portion 225.

With reference to FIG. 4A, an undoped gate silicon film 5 is formed which covers the first and second pillars 11a and 21a. A resist mask 231 is formed by a lithography process. The resist mask 231 covers the first portion 215 of the gate semiconductor film 5, wherein the first portion 215 covers the first pillar 11a. The resist mask 231 does not cover the second portion 225 of the gate semiconductor film 5, wherein the second portion 225 covers the second pillar 21a. A first impurity implantation process is carried out using the resist mask 231 to selectively introduce a p-type impurity into the second portion 225 of the gate semiconductor film 5. The first impurity implantation process can be carried out by introducing boron (B) at a dose of 1E15 atoms/cm$^2$ and at energy of 5 keV. The resist mask 231 is removed. The gate semiconductor film 5 has the first portion 215 of non-doped silicon and the second portion 225 of p-type silicon, wherein the first portion 215 covers the first pillar 11a and the second portion 225 covers the second pillar 21a.

With reference to FIG. 4B, a resist mask 232 is formed by another lithography process. The resist mask 232 does not covers the first portion 215 of the gate semiconductor film 5, wherein the first portion 215 covers the first pillar 11a. The resist mask 232 covers the second portion 225 of the gate semiconductor film 5, wherein the second portion 225 covers the second pillar 21a. A second impurity implantation process is carried out using the resist mask 232 to selectively introduce a p-type impurity into the first portion 215 of the gate semiconductor film 5. The second impurity implantation process can be carried out by introducing boron (B) at a dose of 1E14 atoms/cm2 and at energy of 5 keV. The resist mask 232 is removed. The gate semiconductor film 5 has the first portion 215 of boron-doped silicon and the second portion 225 of boron-doped silicon. The first portion 215 of boron-doped silicon is higher in impurity concentration than the second portion 225 of boron-doped silicon.

Figure 4C:
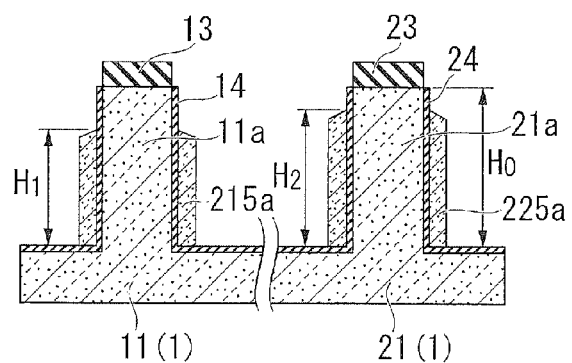
FIG. 4C is a fragmentary cross sectional elevation view illustrating a semiconductor device in a step, subsequent to the step of FIG. 4B, involved in the method of forming the semiconductor device in accordance with the second preferred embodiment of the present invention.

With reference to FIG. 4C, the gate silicon film 5 is etched back by using a chlorine-based gas such as chlorine gas (Cl$_2$), thereby forming first and second gate electrodes 215a and 225a. The first gate electrode 215a surrounds the first pillar 11a. The first gate electrode 215a is separated by the gate insulating film 14 from the side face of the first pillar 11a. The second gate electrode 225a surrounds the second pillar 21a. The second gate electrode 225a is separated by the gate insulating film 24 from the side face of the second pillar 21a. The gate silicon film 5 is selectively removed. The etching back process is carried out to selectively remove removal portions of the gate silicon film 5, while leaving first and second remaining portions 215 and 225 of the gate silicon film 5. The removal portions have covered the surface of the silicon substrate 1 and the first and second masks 13 and 23. The first and second remaining portions 215 and 225 surround the first and second pillars 11a and 21a, respectively. As a result of the selective removal process, the first and second gate electrodes 215a and 225a are formed, which surround the first and second pillars 11a and 21a, respectively.

As the result of the etching process, the gate silicon film 5 is made into the first and second gate electrodes 215a and 225a which have first and second gate heights H1 and H2. In some cases, the first height H1 may be, but is not limited to, 120 nm, and the second height H2 may be, but is not limited to, 140 nm. The gate silicon film 5 was doped with an impurity such as B. The gate silicon film 5 had the first portion which is doped any impurity such as B which covers the first pillar 11a. The gate silicon film 5 had the second portion which is doped any impurity such as B which covers the second pillar 21a. The first portion 215 of boron-doped silicon is lower in impurity concentration than the second portion 225 of boron-doped silicon. The etch back process will form the first and second gate electrodes 215a and 225a, so that the second gate electrode 225a which has the higher impurity concentration is higher in height than the first gate electrode 215a which has the lower impurity concentration. The common etch back process will form the first and second gate electrodes 215a and 225a which are different in height because the first and second gate electrodes 215a and 225a are different in impurity concentration. Namely, the difference in impurity concentration between different portions of the same semiconductor film will allow etch back process for etching back the semiconductor film to form remaining portions with different heights. The remaining portion of higher impurity concentration is higher in height than the remaining portion of lower impurity concentration.

Figure 4D:
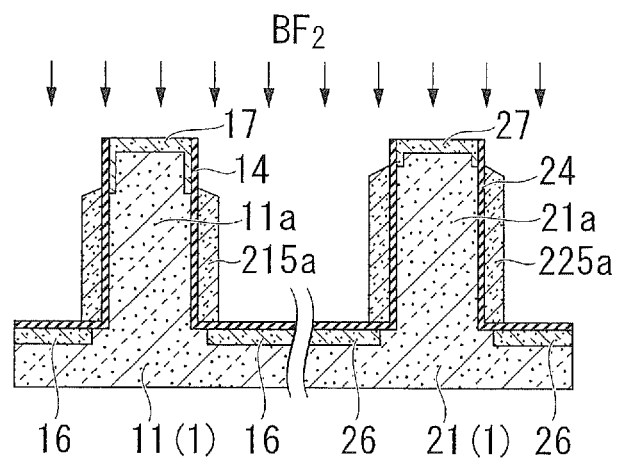
FIG. 4D is a fragmentary cross sectional elevation view illustrating a semiconductor device in a step, subsequent to the step of FIG. 4C, involved in the method of forming the semiconductor device in accordance with the second preferred embodiment of the present invention.
Figure 4E:
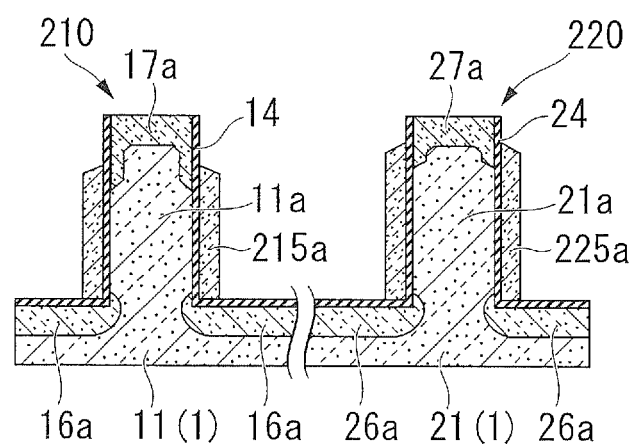
FIG. 4E is a fragmentary cross sectional elevation view illustrating a semiconductor device in a step, subsequent to the step of FIG. 4D, involved in the method of forming the semiconductor device in accordance with the second preferred embodiment of the present invention.

With reference to FIG. 4D, the first and second masks 13 and 23 are removed. An ion-implantation process can be carried out to introduce an impurity into upper portions of the first and second pillars 11a and 21a, the first and second gate electrodes 215a and 225a, and the first and second n-well regions 11 and 21. The impurity may be, but is not limited to, boron difluoride (BF$_2$). The ion-implantation process can be carried out under the following conditions. A dose is 5E15 atoms/cm$^2$. Ion-implantation energy is 15 keV. The ion-implantation process will form first and second lower diffusion regions 16 and 26 and first and second upper diffusion regions 17 and 27. The first and second lower diffusion regions 16 and 26 are self-aligned to the first and second gate electrodes 215a and 225a, respectively. The first and second lower diffusion regions 16 and 26 are formed in the first and second n-well regions 11 and 21, respectively. The first and second lower diffusion regions 16 and 26 are positioned near the bottoms of the first and second pillars 11a and 21a, respectively. The first and second upper diffusion regions 17 and 27 are formed at upper portions of the first and second pillars 11a and 21a, respectively. The first and second lower diffusion regions 16 and 26 serves as one of source and drain regions. The first and second upper diffusion regions 17 and 27 serves as the other of the source and drain regions. The ion-implantation introduces the impurity into the first and second gate electrodes 215a and 225a. The ion-implantation can introduce boron into the first and second gate electrodes 215a and 225a, so that the first and second gate electrodes 215a and 225a are p-type gate electrodes.

With reference to FIG. 4D, a heat treatment can be carried out to activate the impurity implanted in the first and second lower diffusion regions 16 and 26 and the first and second upper diffusion regions 17 and 27. As a result, first and second pillar MOS transistors 210 and 220 are formed over the silicon substrate 1.

The gate semiconductor film is doped with the impurity such as boron B at different doses over different portions, so that the gate semiconductor film has the first portion with the lower impurity concentration covering the first pillar 11a and the second portion with the higher impurity concentration covering the second pillar 21a. The gate semiconductor film is then subjected to the etch-back process using the chlorine-based gas. As a result of the etch-back process, the remaining first portion with the lower impurity concentration surrounding the side face of the first pillar 11a is lower in height than the remaining second portion with the higher impurity concentration surrounding the side face of the second pillar 21a. The common etch-back process can form the gate electrodes having different heights because of difference of etching rate between the first portion with the lower impurity concentration and the second portion with the higher impurity concentration. The etching rate of the first portion with the lower impurity concentration is faster than the etching rate of the second portion with the higher impurity concentration. For example, the etching rate of the second portion to which boron was doped at a dose of 1E15 atoms/cm$^2$ is 85 nm/min. The etching rate of the first portion to which boron was doped at a dose of 1E14 atoms/cm$^2$ is 120 nm/min. The second portion with the higher impurity concentration is slower in etching rate than the first portion with the lower impurity concentration. The difference in etching rate between the first portion with the lower impurity concentration and the second portion with the higher impurity concentration will cause the difference in height between the remaining first portion and the remaining second portion.

As the result of the etching process, the gate silicon film 5 is made into the first and second gate electrodes 215a and 225a which have first and second gate heights H1 and H2. In some cases, the first height H1 may be, but is not limited to, 120 nm, and the second height H2 may be, but is not limited to, 140 nm.

The semiconductor device includes the first and second pillar MOS transistors 210 and 220 which have the first and second gate electrodes 215a and 225a which are different in height from each other. The first and second pillar MOS transistors 210 and 220 are different in gate length from each other.

The impurity such as boron is introduced into the gate silicon film 5 at different doses over different portions so that the gate silicon film 5 includes the first portion 215 with the lower impurity concentration and the second portion 225 with the higher impurity concentration, before the gate silicon film 5 is etched back using the chorine-based gas. The etch-back process etches the first portion 215 at a higher etching rate and the second portion 225 at a lower etching rate. As a result of the etch-back process, the first and second gate electrodes 215a and 225a are formed so that the first gate electrode 215a is lower in height than the second gate electrode 225a. The first and second pillar MOS transistors 210 and 220 are different in gate length from each other.

Third Embodiment

A method of forming a semiconductor device in accordance with a third embodiment will be described with reference to FIGS. 5A through 5F. The third embodiment provides still a method of forming a semiconductor device that includes first, second and third pillar MOS transistors 310, 320 and 330 which have first and second gate electrodes 315a, 325a and 335a which are different in height from each other. The first and second gate electrodes 315a, 325a and 335a are different in gate length from each other.

The method of forming the semiconductor device in accordance with the third embodiment is different from the first and second embodiments in processes shown in FIGS. 5A through 5F. The same or similar steps involved in the method of this embodiment as those of the first and second embodiments will not be described again. The different steps involved in the method of this embodiment shown in FIGS. 5A through 5F are to form three gate electrodes with different gate lengths.

Figure 5A:
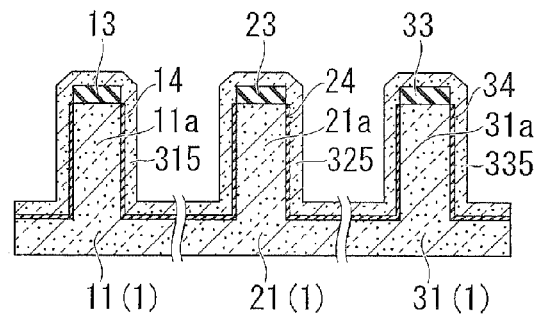
FIG. 5A is a fragmentary cross sectional elevation view illustrating a semiconductor device in a step involved in a method of forming a semiconductor device in accordance with a third preferred embodiment of the present invention.

With reference to FIG. 5A, first, second and third pillars 11a, 21a and 31a are formed in the same processes as described with reference to FIG. 3A in the first embodiment. The first, second and third pillars 11a, 21a and 31a extend vertically or upwardly from the surfaces of n-well regions 11, 21 and 31 of the silicon substrate 1. First, second and third masks 13, 23 and 33 are formed in the same processes as described with reference to FIG. 3A in the first embodiment. Gate insulating films 14, 24 and 34 are formed in the same processes as described with reference to FIG. 3B in the first embodiment. Then, the gate silicon film 5 is formed in the same processes as described with reference to FIG. 3B in the first embodiment. The gate silicon film 5 covers the first, second and third masks 13, 23 and 33 and the gate insulating films 14, 24 and 34. The gate semiconductor film 5 surrounds the first, second and third pillars 11a, 21a and 31a. The gate semiconductor film 5 covers the surface of the n-well regions 11, 21 and 31. The gate semiconductor film 5 may be made of non-doped silicon. The gate semiconductor film 5 may be formed by a CVD method. The gate semiconductor film 5 may have a thickness of, but not limited to, about 20 nm.

The gate semiconductor film 5 includes a first portion 315, a second portion 325 and a third portion 335. The first portion 315 of the gate semiconductor film 5 covers the first pillar 11a. The second portion 325 of the gate semiconductor film 5 covers the second pillar 21a. The third portion 335 of the gate semiconductor film 5 covers the third pillar 31a. The gate semiconductor film 5 is further processed so that the first, second and third portion 315, 325 and 335 are different from each other in at least one of conductivity type and impurity concentration. In some cases, the first portion 315 of the gate semiconductor film 5 is non-doped silicon and the second and third portions 325 and 335 of the gate semiconductor film 5 are p-type silicon. In this case, the second portion 325 is lower in impurity concentration than the third portion 335.

Figure 5B:
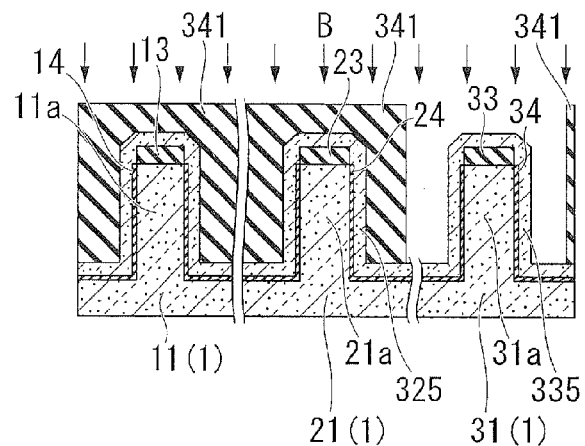
FIG. 5B is a fragmentary cross sectional elevation view illustrating a semiconductor device in a step, subsequent to the step of FIG. 5A, involved in the method of forming the semiconductor device in accordance with the third preferred embodiment of the present invention.

With reference to FIG. 5B, after the undoped gate silicon film 5 is formed which covers the first, second and third pillars 11a, 21a and 31a, a resist mask 341 is formed by a lithography process. The resist mask 341 covers the first and second portions 315 and 325 of the gate semiconductor film 5, wherein the first and second portions 315 and 325 cover the first and second pillars 11a and 21a, respectively. The resist mask 341 does not cover the third portion 335 of the gate semiconductor film 5, wherein the third portion 335 covers the third pillar 31a. A first impurity implantation process is carried out using the resist mask 341 to selectively introduce a p-type impurity into the third portion 335 of the gate semiconductor film 5. The first impurity implantation process can be carried out by introducing boron (B) at a dose of 1E15 atoms/cm$^2$ and at energy of 5 keV. The resist mask 341 is removed. The gate semiconductor film 5 has the first and second portions 315 and 325 of non-doped silicon and the third portion 335 of p-type silicon, wherein the first portion 315 covers the first pillar 11a, the second portion 325 covers the second pillar 21a and the third portion 335 covers the second pillar 31a.

Figure 5C:
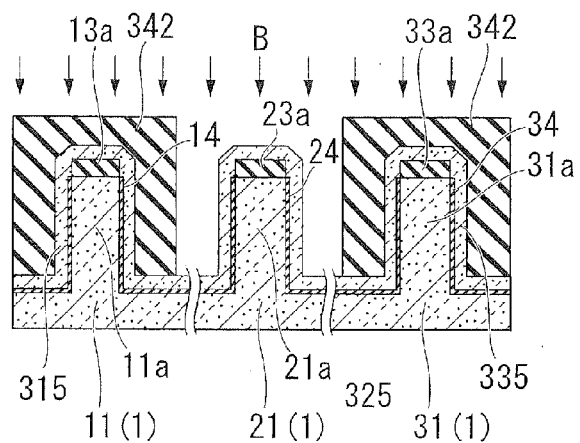
FIG. 5C is a fragmentary cross sectional elevation view illustrating a semiconductor device in a step, subsequent to the step of FIG. 5B, involved in the method of forming the semiconductor device in accordance with the third preferred embodiment of the present invention.

With reference to FIG. 5C, another resist mask 342 is formed by another lithography process. The resist mask 342 covers the first and third portions 315 and 335 of the gate semiconductor film 5, wherein the first and third portions 315 and 335 cover the first and third pillars 11a and 31a, respectively. The resist mask 342 does not cover the second portion 325 of the gate semiconductor film 5, wherein the second portion 325 covers the second pillar 21a. A second impurity implantation process is carried out using the resist mask 342 to selectively introduce a p-type impurity into the second portion 325 of the gate semiconductor film 5. The second impurity implantation process can be carried out by introducing boron (B) at a dose of 1E14 atoms/cm$^2$ and at energy of 5 keV. The second impurity implantation process is lower in dose than the first impurity implantation process. The resist mask 342 is removed. The gate semiconductor film 5 has the first portion 315 of non-doped silicon and the second and third portions 325 and 335 of p-type silicon. The third portion 315 is lower in impurity concentration than the second portion 325. The second portion 325 is lower in impurity concentration than the third portion 335. The first portion 315 covers the first pillar 11a. The second portion 325 covers the second pillar 21a. The third portion 335 covers the second pillar 31a.

Figure 5D:
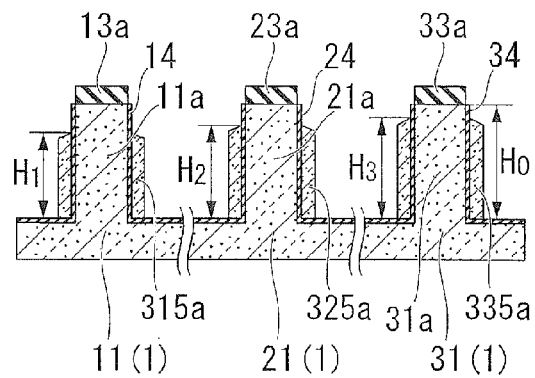
FIG. 5D is a fragmentary cross sectional elevation view illustrating a semiconductor device in a step, subsequent to the step of FIG. 5C, involved in the method of forming the semiconductor device in accordance with the third preferred embodiment of the present invention.

With reference to FIG. 5D, the gate silicon film 5 is etched back by using a chlorine-based gas such as chlorine gas ($Cl_2$), thereby forming first, second and third gate electrodes 315a, 325a and 335a. The first gate electrode 315a surrounds the first pillar 11a. The first gate electrode 315a is separated by the gate insulating film 14 from the side face of the first pillar 11a. The second gate electrode 325a surrounds the second pillar 21a. The second gate electrode 325a is separated by the gate insulating film 24 from the side face of the second pillar 21a. The third gate electrode 335a surrounds the third pillar 31a. The third gate electrode 335a is separated by the gate insulating film 34 from the side face of the third pillar 31a. The gate silicon film 5 is selectively removed. The etching back process is carried out to selectively remove removal portions of the gate silicon film 5, while leaving first, second and third remaining portions 315, 325 and 335 of the gate silicon film 5. The removal portions have covered the surface of the silicon substrate 1 and the first, second and third masks 13, 23 and 33. The first, second and third remaining portions 315, 325 and 335 surround the first, second and third pillars 11a, 21a and 31a, respectively. As a result of the selective removal process, the first, second and third gate electrodes 315a, 325a and 335a are formed, which surround the first, second and third pillars 11a, 21a and 31a, respectively.

As the result of the etching process, the gate silicon film 5 is made into the first, second and third gate electrodes 315a, 325a and 335a which have first, second and third gate heights H1, H2 and H3, respectively. In some cases, the first height H1 may be, but is not limited to, 100 nm, the second height H2 may be, but is not limited to, 120 nm and the third height H3 may be, but is not limited to, 140 nm. The gate silicon film 5 was doped with an impurity such as B. The gate silicon film 5 had the first portion which is non-doped which covers the first pillar 11a. The gate silicon film 5 had the second portion which is doped with any impurity such as B which covers the second pillar 21a. The gate silicon film 5 had the third portion which is doped with any impurity such as B which covers the third pillar 31a. The first portion 315 of non-doped silicon is lower in impurity concentration than the second portion 325 of boron-doped silicon. The second portion 325 of boron-doped silicon is lower in impurity concentration than the third portion 335 of boron-doped silicon. The etch-back process will form the first, second and third gate electrodes 315a, 325a and 335a. The second gate electrode 325a which has the higher impurity concentration is higher in height than the first gate electrode 315a which has the lower impurity concentration. The third gate electrode 335a which has the higher impurity concentration is higher in height than the second gate electrode 325a which has the lower impurity concentration. The common etch back process will form the first, second and third gate electrodes 315a, 325a and 335a which are different in height because the first, second and third gate electrodes 315a, 325a and 335a are different in impurity concentration. Namely, the difference in impurity concentration between different portions of the same semiconductor film will allow etch back process for etching back the semiconductor film to form remaining portions with different heights. The remaining portion of higher impurity concentration is higher in height than the remaining portion of lower impurity concentration.

Figure 5E:
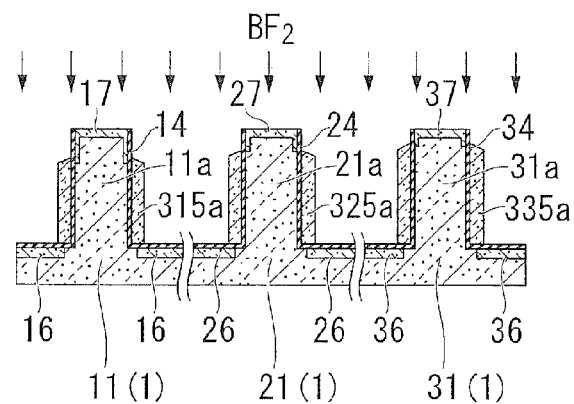
FIG. 5E is a fragmentary cross sectional elevation view illustrating a semiconductor device in a step, subsequent to the step of FIG. 5D, involved in the method of forming the semiconductor device in accordance with the third preferred embodiment of the present invention.

With reference to FIG. 5E, the first, second and third masks 13, 23 and 33 are removed. An ion-implantation process can be carried out to introduce an impurity into upper portions of the first, second and third pillars 11a, 21a and 31a, the first, second and third gate electrodes 315a, 325a and 335a, and the first, second and third n-well regions 11, 21 and 31. The impurity may be, but is not limited to, boron difluoride ($BF_2$). The ion-implantation process can be carried out under the following conditions. A dose is 5E15 atoms/$cm^2$. Ion-implantation energy is 15 keV. The ion-implantation process will form first, second and third lower diffusion regions 16, 26 and 36 as well as first, second and third upper diffusion regions 17, 27 and 37. The first, second and third lower diffusion regions 16, 26 and 36 are self-aligned to the first, second and third gate electrodes 315a, 325a and 335a, respectively. The first, second and third lower diffusion regions 16, 26 and 36 are formed in the first, second and third n-well regions 11, 21 and 31, respectively. The first, second and third lower diffusion regions 16, 26 and 36 are positioned near the bottoms of the first, second and third pillars 11a, 21a and 31a, respectively. The first, second and third upper diffusion regions 17, 27 and 37 are formed at upper portions of the first, second and third pillars 11a, 21a and 31a, respectively. The first, second and third lower diffusion regions 16, 26 and 36 serve as one of source and drain regions. The first, second and third upper diffusion regions 17, 27 and 37 serve as the other of the source and drain regions. The ion-implantation introduces the impurity into the first, second and third gate electrodes 315a, 325a and 335a. The ion-implantation can introduce boron into the first, second and third gate electrodes 315a, 325a and 335a, so that the first, second and third gate electrodes 315a, 325a and 335a are p-type gate electrodes.

Figure 5F:
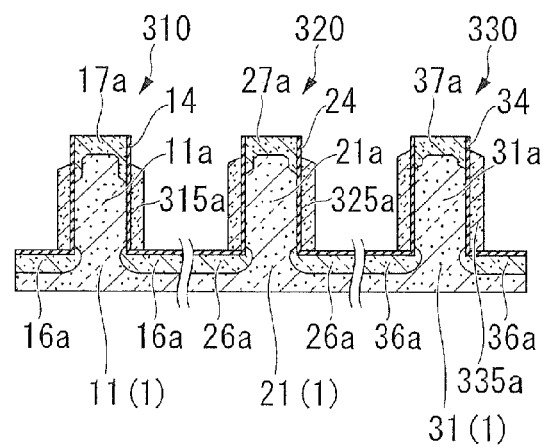
FIG. 5F is a fragmentary cross sectional elevation view illustrating a semiconductor device in a step, subsequent to the step of FIG. 5E, involved in the method of forming the semiconductor device in accordance with the third preferred embodiment of the present invention.

With reference to FIG. 5F, a heat treatment can be carried out to activate the impurity implanted in the first, second and third lower diffusion regions 16, 26 and 36 and the first, second and third upper diffusion regions 17, 27 and 37. As a result, first, second and third pillar MOS transistors 310, 320 and 330 are formed over the silicon substrate 1.

The gate semiconductor film is doped with the impurity such as boron B at different doses over different portions, so that the gate semiconductor film has the first portion with the lowest impurity concentration covering the first pillar 11a, the second portion with the middle impurity concentration covering the second pillar 21a and the third portion with the highest impurity concentration covering the third pillar 31a. The gate semiconductor film is then subjected to the etch-back process using the chlorine-based gas. As a result of the etch-back process, the remaining first portion with the lowest impurity concentration surrounding the side face of the first pillar 11a is lower in height than the remaining second portion with the middle impurity concentration surrounding the side face of the second pillar 21a. The remaining second portion with the middle impurity concentration surrounding the side face of the second pillar 21a is lower in height than the remaining third portion with the highest impurity concentration surrounding the side face of the third pillar 31a. The common etch-back process can form the gate electrodes having different heights because of difference of etching rate among the first portion with the lowest impurity concentration, the second portion with the middle impurity concentration and the third portion with the highest impurity concentration. The etching rate of the first portion with the lowest impurity concentration is faster than the etching rate of the second portion with the middle impurity concentration. The etching rate of the second portion with the middle impurity concentration is faster than the etching rate of the third portion with the highest impurity concentration. For example, the etching rate of the third portion to which boron was doped at a dose of 1E15 atoms/cm$^2$ is 85 nm/min. The etching rate of the second portion to which boron was doped at a dose of 1E14 atoms/cm$^2$ is 120 nm/min. The etching rate of the first portion is 140 nm/min. The second portion with the middle impurity concentration is slower in etching rate than the first portion with the lowest impurity concentration. The third portion with the highest impurity concentration is slower in etching rate than the second portion with the middle impurity concentration. The difference in etching rate among the first portion with the lowest impurity concentration, the second portion with the middle impurity concentration and the third portion with the highest impurity concentration will cause the difference in height among the remaining first portion, the remaining second portion and the remaining third portion.

As the result of the etching process, the gate silicon film 5 is made into the first, second and third gate electrodes 315a, 325a and 335a which have first, second and third gate heights H1, H2 and H3. In some cases, the first height H1 may be, but is not limited to, 100 nm, the second height H2 may be, but is not limited to, 120 nm, and the third height H3 may be, but is not limited to, 140 nm.

The semiconductor device includes the first, second and third pillar MOS transistors 310, 320 and 330 which have the first, second and third gate electrodes 315a, 325a and 335a which are different in height from each other. The first, second and third pillar MOS transistors 310, 320 and 330 are different in gate length from each other.

The impurity such as boron is introduced into the gate silicon film 5 at different doses over different portions so that the gate silicon film 5 includes the first portion 315 with the lowest impurity concentration, the second portion 325 with the middle impurity concentration and the third portion 335 with the highest impurity concentration, before the gate silicon film 5 is etched back using the chorine-based gas. The etch-back process etches the first portion 315 at a highest etching rate, the second portion 325 at a middle etching rate and the third portion 335 at a lowest etching rate. As a result of the etch-back process, the first, second gate electrodes 315a, 325a and 335a are formed so that the first gate electrode 315a is lower in height than the second gate electrode 325a, and that the second gate electrode 325a is lower in height than the third gate electrode 335a. The first, second and third pillar MOS transistors 310, 320 and 330 are different in gate length from each other.

Fourth Embodiment

A method of forming a semiconductor device in accordance with a fourth embodiment will be described with reference to FIGS. 6A through 6E. The fourth embodiment provides still a method of forming a semiconductor device that includes first, second and third pillar MOS transistors 410, 420 and 430 which have first and second gate electrodes 415a, 425a and 435a which are different in height from each other. The first and second gate electrodes 415a, 425a and 435a are different in gate length from each other.

The method of forming the semiconductor device in accordance with the fourth embodiment is different from the first, second and third embodiments in processes shown in FIGS. 6A through 6E. The same or similar steps involved in the method of this embodiment as those of the first, second and third embodiments will not be described again. The different steps involved in the method of this embodiment shown in FIGS. 6A through 6E are to form three gate electrodes with different gate lengths.

Figure 6A:
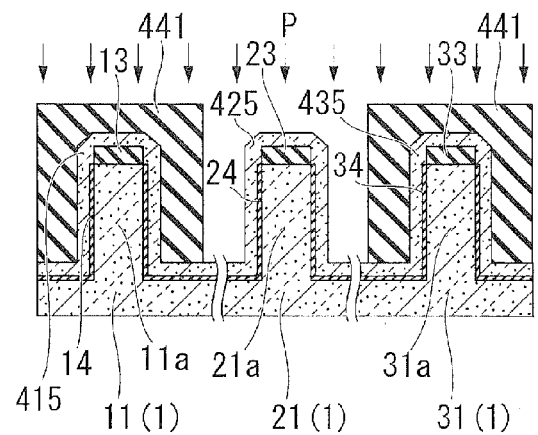
FIG. 6A is a fragmentary cross sectional elevation view illustrating a semiconductor device in a step involved in a method of forming a semiconductor device in accordance with a fourth preferred embodiment of the present invention.

With reference to FIG. 6A, first, second and third pillars 11a, 21a and 31a are formed in the same processes as described with reference to FIG. 3A in the first embodiment. The first, second and third pillars 11a, 21a and 31a extend vertically or upwardly from the surfaces of n-well regions 11, 21 and 31 of the silicon substrate 1. First, second and third masks 13, 23 and 33 are formed in the same processes as described with reference to FIG. 3A in the first embodiment. Gate insulating films 14, 24 and 34 are formed in the same processes as described with reference to FIG. 3B in the first embodiment. Then, the gate silicon film 5 is formed in the same processes as described with reference to FIG. 3B in the first embodiment. The gate silicon film 5 covers the first, second and third masks 13, 23 and 33 and the gate insulating films 14, 24 and 34. The gate semiconductor film 5 surrounds the first, second and third pillars 11a, 21a and 31a. The gate semiconductor film 5 covers the surface of the n-well regions 11, 21 and 31. The gate semiconductor film 5 may be made of non-doped silicon. The gate semiconductor film 5 may be formed by a CVD method. The gate semiconductor film 5 may have a thickness of, but not limited to, about 20 nm.

The gate semiconductor film 5 includes a first portion 415, a second portion 425 and a third portion 435. The first portion 415 of the gate semiconductor film 5 covers the first pillar 11a. The second portion 425 of the gate semiconductor film 5 covers the second pillar 21a. The third portion 435 of the gate semiconductor film 5 covers the third pillar 31a. The gate semiconductor film 5 is further processed so that the first, second and third portion 415, 425 and 435 are different from each other in at least one of conductivity type and impurity concentration. In some cases, the third portion 435 of the gate semiconductor film 5 is non-doped silicon and the first and second portions 415 and 425 of the gate semiconductor film 5 are p-type silicon. In this case, the first portion 415 is lower in impurity concentration than the second portion 425.

After the undoped gate silicon film 5 is formed which covers the first, second and third pillars 11a, 21a and 31a, a resist mask 441 is formed by a lithography process. The resist mask 441 covers the first and third portions 415 and 435 of the gate semiconductor film 5, wherein the first and second portions 415 and 435 cover the first and third pillars 11a and 31a, respectively. The resist mask 441 does not cover the second portion 425 of the gate semiconductor film 5, wherein the second portion 425 covers the second pillar 21a. A first impurity implantation process is carried out using the resist mask 441 to selectively introduce an n-type impurity into the second portion 425 of the gate semiconductor film 5. The first impurity implantation process can be carried out by introducing phosphorus (P) at a dose of 1E14 atoms/cm$^2$ and at energy of 10 keV. The resist mask 441 is removed. The gate semiconductor film 5 has the first and third portions 415 and 435 of non-doped silicon and the second portion 425 of n-type silicon, wherein the first portion 415 covers the first pillar 11a, the second portion 425 covers the second pillar 21a and the third portion 435 covers the second pillar 31a.

Figure 6B:
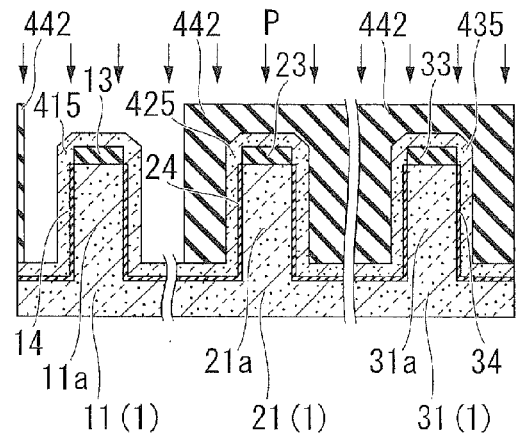
FIG. 6B is a fragmentary cross sectional elevation view illustrating a semiconductor device in a step, subsequent to the step of FIG. 6A, involved in the method of forming the semiconductor device in accordance with the fourth preferred embodiment of the present invention.

With reference to FIG. 6B, another resist mask 442 is formed by another lithography process. The resist mask 442 covers the second and third portions 425 and 435 of the gate semiconductor film 5, wherein the second and third portions 425 and 435 cover the second and third pillars 21a and 31a, respectively. The resist mask 442 does not cover the first portion 415 of the gate semiconductor film 5, wherein the first portion 415 covers the first pillar 11a. A second impurity implantation process is carried out using the resist mask 442 to selectively introduce an n-type impurity into the first portion 415 of the gate semiconductor film 5. The second impurity implantation process can be carried out by introducing phosphorus (P) at a dose of 1E15 atoms/cm² and at energy of 10 keV. The second impurity implantation process is higher in dose than the first impurity implantation process. The resist mask 442 is removed. The gate semiconductor film 5 has the first and second portions 415 and 425 of phosphorus-doped silicon and the third portion 435 of non-doped silicon. The third portion 315 is lower in impurity concentration than the second portion 325. The first portion 415 is higher in impurity concentration than the second portion 425. The first portion 415 covers the first pillar 11a. The second portion 425 covers the second pillar 21a. The third portion 435 covers the second pillar 31a.

Figure 6C:
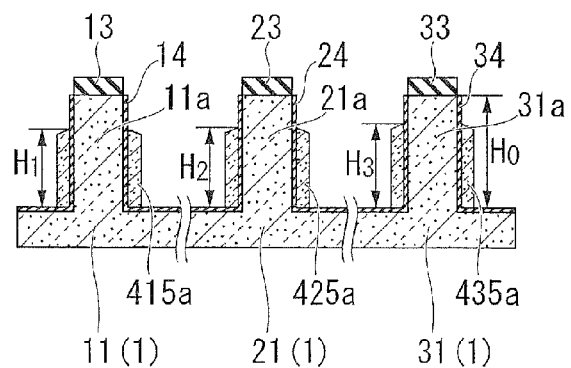
FIG. 6C is a fragmentary cross sectional elevation view illustrating a semiconductor device in a step, subsequent to the step of FIG. 6B, involved in the method of forming the semiconductor device in accordance with the fourth preferred embodiment of the present invention.

With reference to FIG. 6C, the gate silicon film 5 is etched back by using a chlorine-based gas such as chlorine gas (Cl₂), thereby forming first, second and third gate electrodes 415a, 425a and 435a. The first gate electrode 415a surrounds the first pillar 11a. The first gate electrode 415a is separated by the gate insulating film 14 from the side face of the first pillar 11a. The second gate electrode 425a surrounds the second pillar 21a. The second gate electrode 425a is separated by the gate insulating film 24 from the side face of the second pillar 21a. The third gate electrode 435a surrounds the third pillar 31a. The third gate electrode 435a is separated by the gate insulating film 34 from the side face of the third pillar 31a. The gate silicon film 5 is selectively removed. The etching back process is carried out to selectively remove removal portions of the gate silicon film 5, while leaving first, second and third remaining portions 315, 325 and 335 of the gate silicon film 5. The removal portions have covered the surface of the silicon substrate 1 and the first, second and third masks 13, 23 and 33. The first, second and third remaining portions 415, 425 and 435 surround the first, second and third pillars 11a, 21a and 31a, respectively. As a result of the selective removal process, the first, second and third gate electrodes 415a, 425a and 435a are formed, which surround the first, second and third pillars 11a, 21a and 31a, respectively.

As the result of the etching process, the gate silicon film 5 is made into the first, second and third gate electrodes 415a, 425a and 435a which have first, second and third gate heights H1, H2 and H3, respectively. In some cases, the first height H1 may be, but is not limited to, 80 nm, the second height H2 may be, but is not limited to, 90 nm and the third height H3 may be, but is not limited to, 100 nm. The gate silicon film 5 was doped with an impurity such as P. The gate silicon film 5 had the first portion which is doped with any impurity such as P which covers the first pillar 11a. The gate silicon film 5 had the second portion which is doped with any impurity such as B which covers the second pillar 21a. The gate silicon film 5 had the third portion which is non-doped which covers the third pillar 31a. The first portion 415 of phosphorus-doped silicon is higher in impurity concentration than the second portion 425 of phosphorus-doped silicon. The second portion 425 of phosphorus-doped silicon is higher in impurity concentration than the third portion 435 of non-doped silicon. The etch-back process will form the first, second and third gate electrodes 415a, 425a and 435a. The first gate electrode 415a which has the higher impurity concentration is lower in height than the second gate electrode 425a which has the lower impurity concentration. The second gate electrode 425a which has the higher impurity concentration is lower in height than the third gate electrode 435a which has the lower impurity concentration. The common etch back process will form the first, second and third gate electrodes 415a, 425a and 435a which are different in height because the first, second and third gate electrodes 415a, 425a and 435a are different in impurity concentration. Namely, the difference in impurity concentration between different portions of the same semi-conductor film will allow etch back process for etching back the semiconductor film to form remaining portions with different heights. The remaining portion of higher impurity concentration is lower in height than the remaining portion of lower impurity concentration.

This relationship between the height and the impurity concentration is different between different conductivity types of impurity. If the impurity is p-type such as boron (B), the higher impurity concentration will cause the slower etching rate resulting in the higher height, and the lower impurity concentration will cause the faster etching rate resulting in the lower height. If the impurity is n-type such as phosphorus (P), the higher impurity concentration will cause the faster etching rate resulting in the lower height, and the lower impurity concentration will cause the slower etching rate resulting in the higher height.

Figure 6D:
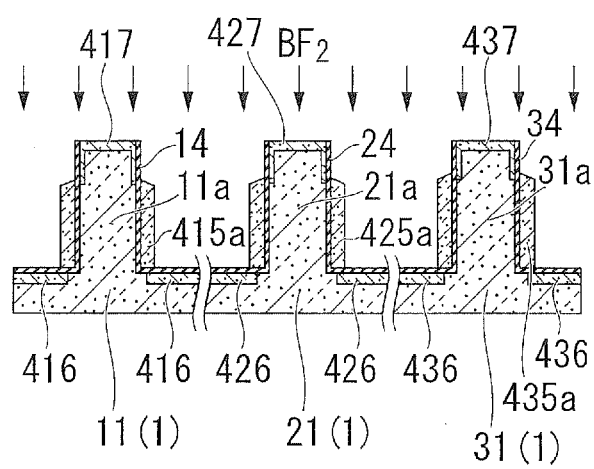
FIG. 6D is a fragmentary cross sectional elevation view illustrating a semiconductor device in a step, subsequent to the step of FIG. 6C, involved in the method of forming the semiconductor device in accordance with the fourth preferred embodiment of the present invention.

With reference to FIG. 6D, the first, second and third masks 13, 23 and 33 are removed. An ion-implantation process can be carried out to introduce an impurity into upper portions of the first, second and third pillars 11a, 21a and 31a, the first, second and third gate electrodes 415a, 425a and 435a, and the first, second and third n-well regions 11, 21 and 31. The impurity may be, but is not limited to, boron difluoride (BF₂). The ion-implantation process can be carried out under the following conditions. A dose is 5E15 atoms/cm². Ion-implantation energy is 15 keV. The ion-implantation process will form first, second and third lower diffusion regions 416, 426 and 436 as well as first, second and third upper diffusion regions 417, 427 and 437. The first, second and third lower diffusion regions 416, 426 and 436 are self-aligned to the first, second and third gate electrodes 415a, 425a and 435a, respectively. The first, second and third lower diffusion regions 416, 426 and 436 are formed in the first, second and third n-well regions 11, 21 and 31, respectively. The first, second and third lower diffusion regions 416, 426 and 436 are positioned near the bottoms of the first, second and third pillars 11a, 21a and 31a, respectively. The first, second and third upper diffusion regions 417, 427 and 437 are formed at upper portions of the first, second and third pillars 11a, 21a and 31a, respectively. The first, second and third lower diffusion regions 416, 426 and 436 serve as one of source and drain regions. The first, second and third upper diffusion regions 417, 427 and 437 serve as the other of the source and drain regions. The ion-implantation introduces the impurity into the first, second and third gate electrodes 415a, 425a and 435a. The ion-implantation can introduce boron into the first, second and third gate electrodes 415a, 425a and 435a. The first and second gate electrodes 415a and 425a are n-type silicon, and the third gate electrode is non-doped silicon. The dose of boron is 5E15 atoms/cm² which is higher than the doses of phosphorus which are 1E15 atoms/cm² and 1E14 atoms/cm². As a result of the ion-implantation process of boron, the first, second and third gate electrodes 415a, 425a and 435a are p-type gate electrodes.

Figure 6E:
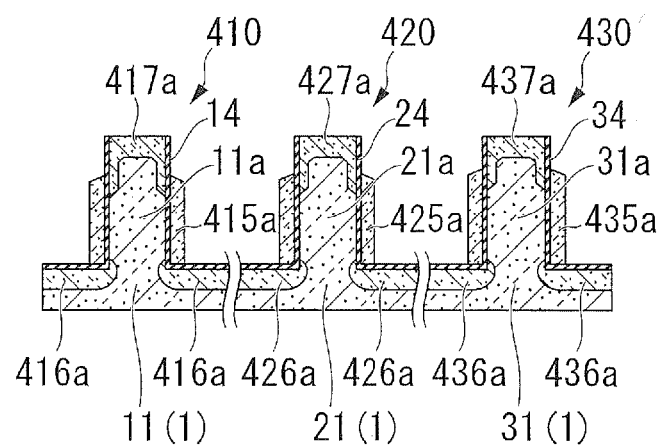
FIG. 6E is a fragmentary cross sectional elevation view illustrating a semiconductor device in a step, subsequent to the step of FIG. 6D, involved in the method of forming the semiconductor device in accordance with the fourth preferred embodiment of the present invention.

With reference to FIG. 6E, a heat treatment can be carried out to activate the impurity implanted in the first, second and third lower diffusion regions 416, 426 and 436 and the first, second and third upper diffusion regions 417, 427 and 437. As a result, first, second and third pillar MOS transistors 410, 420 and 430 are formed over the silicon substrate 1.

The gate semiconductor film is doped with the impurity such as phosphorous P at different doses over different portions, so that the gate semiconductor film has the first portion with the highest n-type impurity concentration covering the first pillar 11a, the second portion with the middle n-type impurity concentration covering the second pillar 21a and the third portion with the lowest impurity concentration covering the third pillar 31a. The gate semiconductor film is then subjected to the etch-back process using the chlorine-based gas. As a result of the etch-back process, the remaining first portion with the highest n-type impurity concentration surrounding the side face of the first pillar 11a is lower in height than the remaining second portion with the middle n-type impurity concentration surrounding the side face of the second pillar 21a. The remaining second portion with the middle n-type impurity concentration surrounding the side face of the second pillar 21a is lower in height than the remaining third portion with the lowest n-type impurity concentration surrounding the side face of the third pillar 31a. The common etch-back process can form the gate electrodes having different heights because of difference of etching rate among the first portion with the highest n-type impurity concentration, the second portion with the middle n-type impurity concentration and the third portion with the lowest impurity concentration. The etching rate of the first portion with the highest n-type impurity concentration is faster than the etching rate of the second portion with the middle n-type impurity concentration. The etching rate of the second portion with the middle n-type impurity concentration is faster than the etching rate of the third portion with the lowest n-type impurity concentration. For example, the etching rate of the first portion to which phosphorous (P) was doped at a dose of 1E15 atoms/cm$^2$ is 160 nm/min. The etching rate of the second portion to which phosphorous (P) was doped at a dose of 1E14 atoms/cm$^2$ is 150 nm/min. The etching rate of the third portion which is undoped is 140 nm/min. The second portion with the middle n-type impurity concentration is slower in etching rate than the first portion with the highest n-type impurity concentration. The third portion with the lowest n-type impurity concentration is slower in etching rate than the second portion with the middle n-type impurity concentration. The difference in etching rate among the first portion with the highest n-type impurity concentration, the second portion with the middle n-type impurity concentration and the third portion with the lowest impurity concentration will cause the difference in height among the remaining first portion, the remaining second portion and the remaining third portion.

This relationship between the height and the impurity concentration is different between different conductivity types of impurity. If the impurity is p-type such as boron (B), the higher impurity concentration will cause the slower etching rate resulting in the higher height, and the lower impurity concentration will cause the faster etching rate resulting in the lower height. If the impurity is n-type such as phosphorus (P), the higher impurity concentration will cause the faster etching rate resulting in the lower height, and the lower impurity concentration will cause the slower etching rate resulting in the higher height.

As the result of the etching process, the gate silicon film 5 is made into the first, second and third gate electrodes 415a, 425a and 435a which have first, second and third gate heights H1, H2 and H3. In some cases, the first height H1 may be, but is not limited to, 80 nm, the second height H2 may be, but is not limited to, 90 nm, and the third height H3 may be, but is not limited to, 100 nm.

The semiconductor device includes the first, second and third pillar MOS transistors 410, 420 and 430 which have the first, second and third gate electrodes 415a, 425a and 435a which are different in height from each other. The first, second and third pillar MOS transistors 410, 420 and 430 are different in gate length from each other.

The impurity such as boron is introduced into the gate silicon film 5 at different doses over different portions so that the gate silicon film 5 includes the first portion 415 with the highest n-type impurity concentration, the second portion 425 with the middle n-type impurity concentration and the third portion 435 with the lowest n-type impurity concentration, before the gate silicon film 5 is etched back using the chorine-based gas. The etch-back process etches the first portion 415 at a highest etching rate, the second portion 425 at a middle etching rate and the third portion 435 at a lowest etching rate. As a result of the etch-back process, the first, second gate electrodes 415a, 425a and 435a are formed so that the first gate electrode 415a is lower in height than the second gate electrode 425a, and that the second gate electrode 425a is lower in height than the third gate electrode 435a. The first, second and third pillar MOS transistors 410, 420 and 430 are different in gate length from each other.

Introducing a phosphorous impurity into a silicon film will increase etching rate of the silicon film. Increasing the phosphorous impurity concentration of the silicon film will increase the etching rate of the silicon film. Introducing a boron impurity into the silicon film will decrease the etching rate of the silicon film. Increasing the boron impurity concentration of the silicon film will decrease the etching rate of the silicon film. The selection of the conductivity type of impurity and the adjustment of the impurity concentration can adjust the etching rate of the silicon film which is subjected to the etch-back process using chlorine-based gases. The portion with a higher phosphorous impurity concentration is faster in etching rate than the portion with a lower phosphorous impurity concentration. The portion with the lower phosphorous impurity concentration is faster in etching rate than a non-doped portion. The non-doped portion is faster in etching rate than the portion with a lower boron impurity concentration. The portion with the lower boron impurity concentration is faster than the portion with a highest boron impurity concentration.

In modified cases, the first portion 415 is doped with phosphorous (P) at a dose of 1E15 atoms/cm$^2$, the second portion 425 is undoped, and the third portion 435 is doped with boron (B) at a dose of 1E15 atoms/cm$^2$. The etching rate of the first portion to which phosphorous (P) was doped at a dose of 1E15 atoms/cm$^2$ is 160 nm/min. The etching rate of the second portion which is non-doped is 140 nm/min. The etching rate of the third portion to which boron (B) was doped at a dose of 1E15 atoms/cm$^2$ is 85 nm/min. Introducing different conductivity type impurities into different portions of a silicon film will increase the difference in etching rate between the different portions, resulting in increased difference in height of the remaining different portions. Introducing different conductivity type impurities into different portions of the silicon film will decrease the minimum necessary height H0 of pillars, wherein the minimum necessary height H0 is necessary to get a desired difference in height of gate electrodes. Decreasing the minimum necessary height H0 of pillars will decrease the amount of etching a silicon substrate to form the pillars having the minimum necessary height H0. Introducing different conductivity type impurities into different portions of the silicon film will also decrease the minimum necessary time t of the etch-back process, wherein the minimum necessary time t of the etch-back process is necessary to get a desired difference in height of gate electrodes. Decreasing the minimum necessary time t of the etch-back process will increase throughput.

Fifth Embodiment

A method of forming a semiconductor device in accordance with a fifth embodiment will be described with reference to FIGS. 7A through 7B. The fifth embodiment provides a method of forming a semiconductor device that includes first and second pillar MOS transistors 510 and 520 of n-channel which have first and second gate electrodes 515a and 525a which are different in height from each other. The first and second pillar MOS transistors 510 and 520 are different in gate length from each other. The first and second pillar MOS transistors 510 and 520 have n-channels, n-type lower and upper diffusion regions serving as source and drain regions. The first and second pillar MOS transistors 510 and 520 are formed in well regions.

Figure 7A:
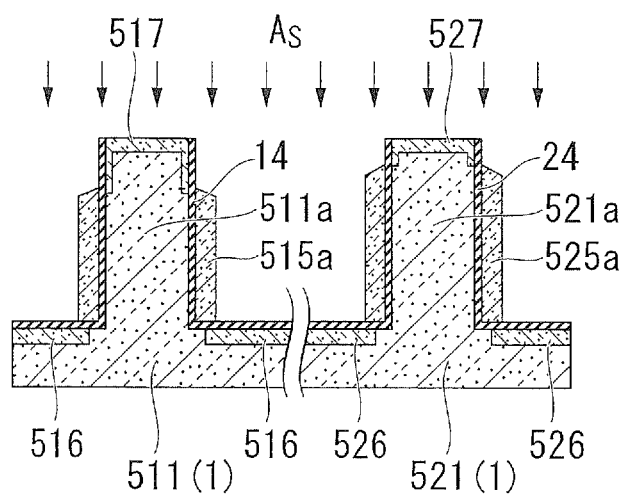
FIG. 7A is a fragmentary cross sectional elevation view illustrating a semiconductor device in a step involved in a method of forming a semiconductor device in accordance with a fifth preferred embodiment of the present invention.
Figure 7B:
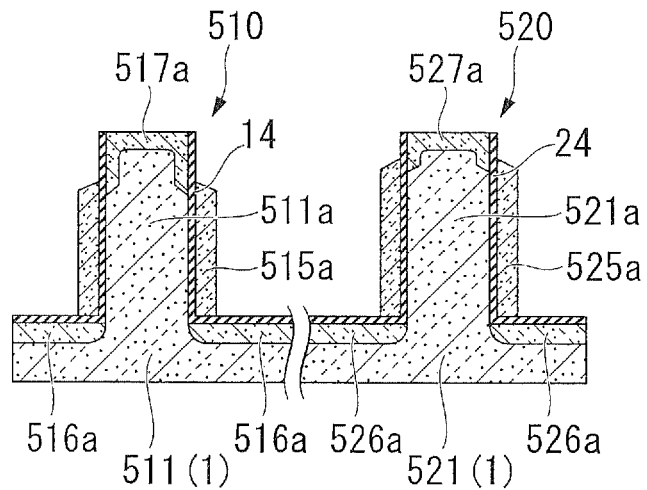
FIG. 7B is a fragmentary cross sectional elevation view illustrating a semiconductor device in a step, subsequent to the step of FIG. 7A, involved in the method of forming the semiconductor device in accordance with the fifth preferred embodiment of the present invention.

The method of forming the semiconductor device in accordance with the fifth embodiment is different from that in accordance with the first and second embodiments in processes shown in FIGS. 7A and 7B. The same or similar steps involved in the method of this embodiment as those of the first and second embodiments will not be described again. The different steps involved in the method of this embodiment shown in FIGS. 7A and 7B are to form well regions and lower and upper diffusion regions.

With reference to FIG. 7A, an isolation region is formed in a silicon substrate 1 to form active regions in the silicon substrate 1. An impurity of p-type is introduced into the active regions to form first and second p-well regions 511 and 521. The impurity of p-type may be B. A lithography process and a dry etching process are carried out to form first and second masks in the first and second p-well regions 511 and 521. A selective etching process is carried out by using the first and second masks as masks to selectively etch the silicon substrate 1, thereby forming first and second pillars 511a and 521a in the first and second p-well regions 511 and 521, respectively. The first and second masks cover the first and second pillars 511a and 521a. The first and second pillars 511a and 521a are silicon pillars.

Gate insulating films 14 and 24 are formed in the same processes as those in the first to third embodiments. First and second gate electrodes 515a and 525a are formed in the same processes as those in the first embodiment. The first gate electrode 515a is non-doped. The second gate electrode 525a is boron-doped. The first and second masks are removed.

An ion-implantation process can be carried out to introduce an impurity of p-type into upper portions of the first and second pillars 511a and 521a, the first and second gate electrodes 515a and 525a, and the first and second p-well regions 511 and 521. The impurity may be, but is not limited to, arsenic (As$^+$) instead of boron difluoride (BF$_2$). The ion-implantation process can be carried out under the following conditions. A dose is 5E15 atoms/cm$^2$. Ion-implantation energy is 15 keV. The ion-implantation process will form first and second lower diffusion regions 516 and 526 of n-type and first and second upper diffusion regions 517 and 527 of n-type. The first and second lower diffusion regions 516 and 526 of n-type are self-aligned to the first and second gate electrodes 515a and 525a, respectively. The first and second lower diffusion regions 516 and 526 of n-type are formed in the first and second p-well regions 511 and 521, respectively. The first and second lower diffusion regions 516 and 526 of n-type are positioned near the bottoms of the first and second pillars 511a and 521a, respectively. The first and second upper diffusion regions 517 and 527 are formed at upper portions of the first and second pillars 511a and 521a, respectively. The first and second lower diffusion regions 516 and 526 of n-type serve as one of source and drain regions. The first and second upper diffusion regions 517 and 527 of n-type serves as the other of the source and drain regions. The ion-implantation introduces the impurity of arsenic into the first and second gate electrodes 515a and 525a which are non-doped and boron-doped, respectively. The ion-implantation can introduce arsenic into the first and second gate electrodes 515a and 525a which are non-doped and boron-doped, respectively, so that the first and second gate electrodes 515a and 525a become n-type gate electrodes.

With reference to FIG. 7B, a heat treatment can be carried out to activate the impurity implanted in the first and second lower diffusion regions 516 and 526 and the first and second upper diffusion regions 517 and 527. As a result, first and second pillar MOS transistors 510 and 520 of n-channel are formed over the silicon substrate 1.

It is possible as a modification to use the method of the above-described fourth embodiment to get large difference in gate length or gate height.

Sixth Embodiment

A method of forming a semiconductor device in accordance with a sixth embodiment will be described with reference to FIGS. 8A through 8G The sixth embodiment provides a method of forming a semiconductor device that includes first and second pillar MOS transistors 610 and 620 which have first and second gate electrodes 615a and 625a which are different in height from each other. The first and second pillar MOS transistors 610 and 620 are different in gate length from each other. The first and second pillar MOS transistors 610 and 620 are also different in conductivity type of channel. The first pillar MOS transistor 610 has an n-channel and lower and upper n-type impurity diffusion regions 616a and 617a. The second pillar MOS transistor 620 has a p-channel and lower and upper p-type impurity diffusion regions 626a and 627a.

The method of forming the semiconductor device in accordance with the sixth embodiment is different from that in accordance with the first embodiment in processes shown in FIGS. 8A through 8G. The same or similar steps involved in the method of this embodiment as those of the first embodiment will not be described again. The different steps involved in the method of this embodiment shown in FIGS. 8A through 8G are to form first and second pillar MOS transistors 610 and 620 which are different from each other in channel conductivity type and in gate length.

Figure 8A:
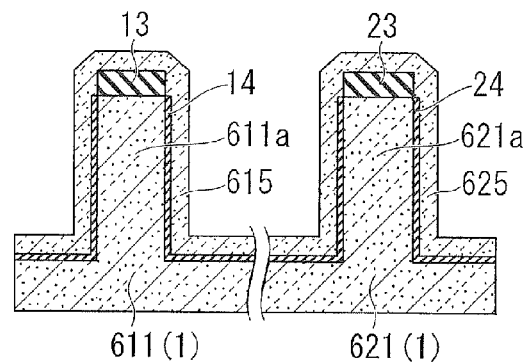
FIG. 8A is a fragmentary cross sectional elevation view illustrating a semiconductor device in a step involved in a method of forming a semiconductor device in accordance with a sixth preferred embodiment of the present invention.

With reference to FIG. 8A, an isolation region is formed in a silicon substrate 1 to form active regions in the silicon substrate 1. An impurity of p-type is selectively introduced into one of the active regions to form a first p-well region 611. The impurity of p-type may be B. An impurity of n-type is then selectively introduced into the other of the active regions to form a second n-well region 621. The impurity of n-type may be P.

A lithography process and a dry etching process are carried out to form first and second masks 13 and 23 in the first p-well and second n-well regions 611 and 621. A selective etching process is carried out by using the first and second masks 13 and 23 as masks to selectively etch the silicon substrate 1, thereby forming first and second pillars 611a and 621a in the first p-well and second n-well regions 611 and 621, respectively. The first and second masks cover the first and second pillars 611a and 621a. The first and second pillars 611a and 621a are p-type and n-type silicon pillars, respectively.

The gate insulating films 14 and 24 are formed in the same processes as described with reference to FIG. 3B in the first embodiment. Then, the gate silicon film 5 is formed in the same processes as described with reference to FIG. 3B in the first embodiment. The gate silicon film 5 covers the first and second masks 13 and 23 and the gate insulating films 14 and 24. The gate semiconductor film 5 surrounds the first p-type and second n-type pillars 611a and 621a. The gate semiconductor film 5 covers the surface of the first p-well and second n-well regions 611 and 621. The gate semiconductor film 5 may be made of non-doped silicon.

The gate semiconductor film 5 includes a first portion 615 and a second portion 625. The first portion 615 of the gate semiconductor film 5 covers the first pillar 611a. The second portion 625 of the gate semiconductor film 5 covers the second pillar 621a. The gate semiconductor film 5 is further processed so that the first portion 615 of the gate semiconductor film 5 is different in at least one of conductivity type and impurity concentration from the second portion 625 of the gate semiconductor film 5. In some cases, the first portion 615 of the gate semiconductor film 5 is n-type silicon and the second portion 625 of the gate semiconductor film 5 is p-type silicon. The first portion 615 and the second portion 625 are different in conductivity type from each other.

Figure 8B:
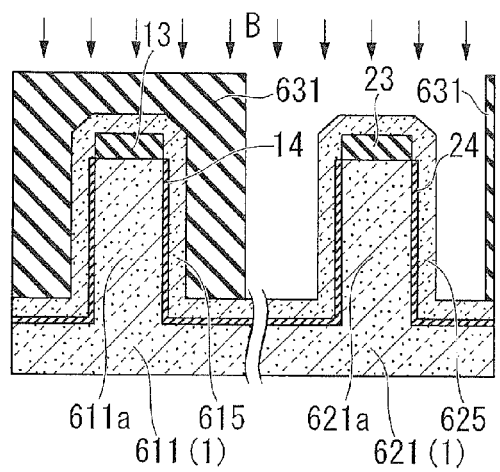
FIG. 8B is a fragmentary cross sectional elevation view illustrating a semiconductor device in a step, subsequent to the step of FIG. 8A, involved in the method of forming the semiconductor device in accordance with the sixth preferred embodiment of the present invention.

With reference to FIG. 8B, after the undoped gate silicon film 5 is formed which covers the first and second pillars 611a and 621a, then a resist mask 631 is formed by a lithography process. The resist mask 631 covers the first portion 615 of the gate semiconductor film 5, wherein the first portion 615 covers the first pillar 611a. The resist mask 631 does not cover the second portion 625 of the gate semiconductor film 5, wherein the second portion 625 covers the second pillar 621a. A first impurity implantation process is carried out using the resist mask 631 to selectively introduce a p-type impurity into the second portion 625 of the gate semiconductor film 5. The first impurity implantation process can be carried out by introducing boron (B) at a dose of 1E15 atoms/cm$^2$ and at energy of 5 keV. The resist mask 631 is removed. The gate semiconductor film 5 has the first portion 615 of non-doped silicon and the second portion 625 of p-type silicon, wherein the first portion 615 covers the first pillar 611a and the second portion 625 covers the second pillar 621a.

Figure 8C:
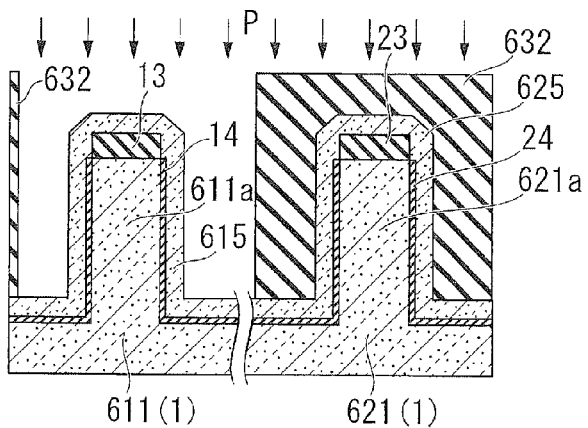
FIG. 8C is a fragmentary cross sectional elevation view illustrating a semiconductor device in a step, subsequent to the step of FIG. 8B, involved in the method of forming the semiconductor device in accordance with the sixth preferred embodiment of the present invention.

With reference to FIG. 8C, a resist mask 632 is formed by another lithography process. The resist mask 632 does not cover the first portion 615 of the gate semiconductor film 5, wherein the first portion 615 covers the first pillar 611a. The resist mask 632 covers the second portion 625 of the gate semiconductor film 5, wherein the second portion 625 covers the second pillar 621a. A second impurity implantation process is carried out using the resist mask 632 to selectively introduce an n-type impurity into the first portion 615 of the gate semiconductor film 5. The second impurity implantation process can be carried out by introducing phosphorus (P) at a dose of 1E15 atoms/cm$^2$ and at energy of 10 keV. The resist mask 632 is removed. The gate semiconductor film 5 has the first portion 615 of phosphorous-doped silicon and the second portion 625 of boron-doped silicon, wherein the first portion 615 covers the first pillar 611a and the second portion 625 covers the second pillar 621a.

Figure 8D:
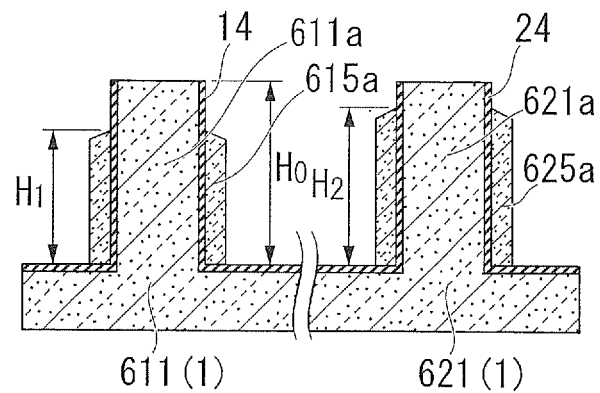
FIG. 8D is a fragmentary cross sectional elevation view illustrating a semiconductor device in a step, subsequent to the step of FIG. 8C, involved in the method of forming the semiconductor device in accordance with the sixth preferred embodiment of the present invention.

With reference to FIG. 8D, the gate silicon film 5 is etched back by using a chlorine-based gas such as chlorine gas ($Cl_2$), thereby forming first and second gate electrodes 615a and 625a. The first gate electrode 615a surrounds the first pillar 611a. The first gate electrode 615a is separated by the gate insulating film 14 from the side face of the first pillar 611a. The second gate electrode 625a surrounds the second pillar 621a. The second gate electrode 625a is separated by the gate insulating film 24 from the side face of the second pillar 621a. The gate silicon film 5 is selectively removed. The etching back process is carried out to selectively remove removal portions of the gate silicon film 5, while leaving first and second remaining portions 615 and 625 of the gate silicon film 5. The removal portions have covered the surface of the silicon substrate 1 and the first and second masks 13 and 23. The first and second remaining portions 615 and 625 surround the first and second pillars 611a and 621a, respectively.

As a result of the selective removal process, the first and second gate electrodes 615a and 625a are formed, which surround the first and second pillars 611a and 621a, respectively. The first and second masks 13 and 23 are removed.

As the result of the etching process, the gate silicon film 5 is made into the first and second gate electrodes 615a and 625a which have first and second gate heights H1 and H2. In some cases, the first height H1 may be, but is not limited to, 80 nm, and the second height H2 may be, but is not limited to, 140 nm. The gate silicon film 5 was doped with B and P. The gate silicon film 5 had the first portion which is doped with P which covers the first pillar 611a. The gate silicon film 5 had the second portion which is doped with B which covers the second pillar 621a. The first portion 615 of phosphorous-doped silicon is faster in etching rate than the second portion 625 of boron-doped silicon. Introducing a phosphorous impurity into a silicon film will increase etching rate of the silicon film. Increasing the phosphorous impurity concentration of the silicon film will increase the etching rate of the silicon film. Introducing a boron impurity into the silicon film will decrease the etching rate of the silicon film. Increasing the boron impurity concentration of the silicon film will decrease the etching rate of the silicon film. The selection of the conductivity type of impurity can differentiate the etching rate of the silicon film which is subjected to the etch-back process using chlorine-based gases. The portion doped with a phosphorous impurity is faster in etching rate than the portion doped with boron impurity. The etch back process will form the first and second gate electrodes 615a and 625a, so that the second gate electrode 625a doped with the boron impurity is higher in height than the first gate electrode 615a doped with the phosphorous impurity. The common etch back process will form the first and second gate electrodes 615a and 625a which are different in height because the first and second gate electrodes 615a and 625a are different in impurity conductivity. Namely, the difference in impurity conductivity between different portions of the same semiconductor film will allow etch back process for etching back the semiconductor film to form remaining portions with different heights. The remaining portion doped with boron impurity is higher in height than the remaining portion of doped with phosphorous impurity.

Figure 8E:
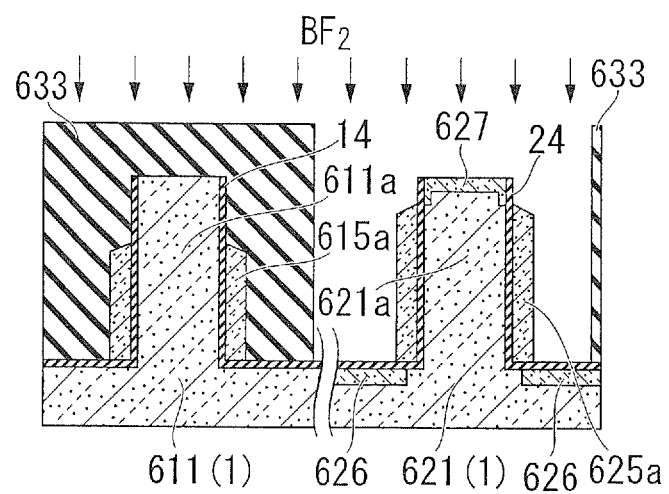
FIG. 8E is a fragmentary cross sectional elevation view illustrating a semiconductor device in a step, subsequent to the step of FIG. 8D, involved in the method of forming the semiconductor device in accordance with the sixth preferred embodiment of the present invention.

With reference to FIG. 8E, a resist mask 633 is formed by still another lithography process. The resist mask 633 covers the first gate electrode 615a and the first pillar 611a. The resist mask 633 does not cover the second gate electrode 625a and the second pillar 621a. A third impurity implantation process is carried out using the resist mask 633 to selectively introduce a p-type impurity into an upper portion of the second pillar 621a, the second gate electrode 625a, and the second p-well region 621. The impurity may be, but is not limited to, boron difluoride ($BF_2$). The ion-implantation process can be carried out under the following conditions. A dose is 5E15 atoms/cm$^2$. Ion-implantation energy is 15 keV. The ion-implantation process will form a second lower diffusion region 626 and a second upper diffusion region 627. The second lower diffusion region 626 is self-aligned to the second gate electrode 625a. The second lower diffusion region 626 is formed in the second p-well region 621. The second lower diffusion region 626 is positioned near the bottom of the second pillar 621a. The second upper diffusion region 627 is formed at an upper portion of the second pillar 621a. The second lower diffusion region 626 serves as one of source and drain regions. The second upper diffusion region 627 serves as the other of the source and drain regions. The ion-implantation introduces the p-type impurity into the second gate electrode 625a. The ion-implantation can introduce boron difluoride (BF$_2$) into the second gate electrode 625*a*, so that the second gate electrode 625*a* is a p-type gate electrode. The resist mask 633 is removed.

Figure 8F:
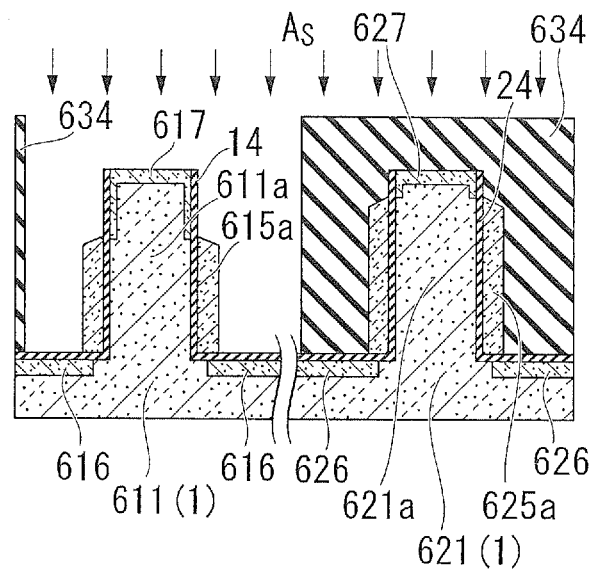
FIG. 8F is a fragmentary cross sectional elevation view illustrating a semiconductor device in a step, subsequent to the step of FIG. 8E, involved in the method of forming the semiconductor device in accordance with the sixth preferred embodiment of the present invention.

With reference to FIG. 8F, a resist mask 634 is formed by yet another lithography process. The resist mask 634 does not cover the first gate electrode 615*a* and the first pillar 611*a*. The resist mask 634 covers the second gate electrode 625*a* and the second pillar 621*a*. A fourth impurity implantation process is carried out using the resist mask 634 to selectively introduce an n-type impurity into an upper portion of the first pillar 611*a*, the first gate electrode 615*a*, and the first n-well region 611. The impurity may be, but is not limited to, arsenic (As). The ion-implantation process can be carried out under the following conditions. A dose is 5E15 atoms/cm$^2$. Ion-implantation energy is 15 keV. The ion-implantation process will form a first lower diffusion region 616 and a first upper diffusion region 617. The first lower diffusion region 616 is self-aligned to the first gate electrode 615*a*. The first lower diffusion region 616 is formed in the first n-well region 611. The first lower diffusion region 616 is positioned near the bottom of the first pillar 611*a*. The first upper diffusion region 617 is formed at an upper portion of the first pillar 611*a*. The first lower diffusion region 616 serves as one of source and drain regions. The first upper diffusion region 617 serves as the other of the source and drain regions. The ion-implantation introduces the n-type impurity into the first gate electrode 615*a*. The ion-implantation can introduce arsenic (As) into the first gate electrode 615*a*, so that the first gate electrode 615*a* is an n-type gate electrode. The resist mask 634 is removed.

Figure 8G:
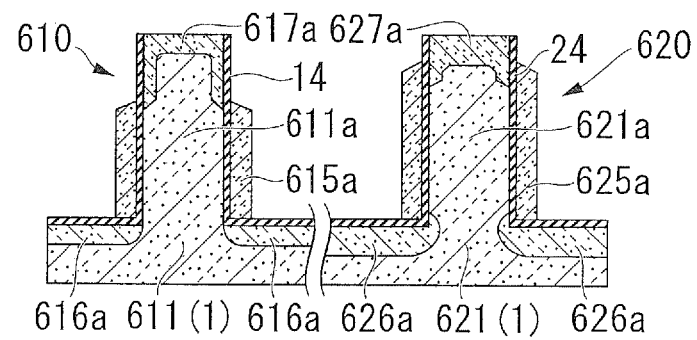
FIG. 8G is a fragmentary cross sectional elevation view illustrating a semiconductor device in a step, subsequent to the step of FIG. 8F, involved in the method of forming the semiconductor device in accordance with the sixth preferred embodiment of the present invention.

With reference to FIG. 8G, a heat treatment can be carried out to activate the n-type and p-type impurities implanted in the first and second lower diffusion regions 616 and 626 and the first and second upper diffusion regions 617 and 627. As a result, first and second pillar MOS transistors 610 and 620 are formed over the silicon substrate 1. The first and second pillar MOS transistors 610 and 620 are n-channel and p-channel transistors, respectively.

The gate semiconductor film is doped with different conductivity type impurities such as boron P and B, so that the gate semiconductor film has the first portion doped with the n-type impurity P covering the first pillar 611*a* and the second portion doped with the p-type impurity B covering the second pillar 621*a*. The gate semiconductor film is then subjected to the etch-back process using the chlorine-based gas. The remaining first portion doped with the n-type impurity P surrounding the side face of the first pillar 611*a* is faster in etching rate than the remaining second portion doped with the p-type impurity B surrounding the side face of the second pillar 621*a*. As a result of the etch-back process, the remaining first portion doped with the n-type impurity P surrounding the side face of the first pillar 611*a* is lower in height than the remaining second portion doped with the p-type impurity B surrounding the side face of the second pillar 621*a*. The common etch-back process can form the gate electrodes having different heights because of difference of etching rate between the first portion doped with the n-type impurity P and the second portion doped with the p-type impurity B. For example, the etching rate of the second portion to which boron was doped at a dose of 1E15 atoms/cm$^2$ is 85 nm/min. The etching rate of the first portion to which boron was doped at a dose of 1E15 atoms/cm$^2$ is 160 nm/min. The second portion doped with the p-type impurity B is slower in etching rate than the first portion doped with the n-type impurity P. The difference in etching rate between the first portion doped with the n-type impurity P and the second portion doped with the p-type impurity B will cause the difference in height between the remaining first portion and the remaining second portion. The first height H1 may be, but is not limited to, 80 nm, and the second height H2 may be, but is not limited to, 140 nm.

The first n-channel pillar MOS transistor 610 includes phosphorous-diffusion regions serving as source and drain regions. The second p-channel pillar MOS transistor 620 includes boron-diffusion regions serving as source and drain regions. Boron is larger in thermal diffusion coefficient than phosphorus. The second p-channel pillar MOS transistor 620 is larger in thermal diffusion of source and drain regions than the first n-channel pillar MOS transistor 610.

If, contrary to this embodiment, the first and second pillar MOS transistors 610 and 620 had the same gate height, the second p-channel pillar MOS transistor 620 would be shorter in effective channel length than the first n-channel pillar MOS transistor 610 by the difference in thermal diffusion of the impurities. The second p-channel pillar MOS transistor 620 could have short channel effects such as current increase and drop of withstand voltage between source and drain. In order to avoid such short channel effects, it is necessary to increase the gate length or the gate height for both the first and second pillar MOS transistors 610 and 620. Increasing the gate length of the first n-channel pillar MOS transistor 610 will drop the driving ability of the n-channel pillar MOS transistor 610.

In accordance with this embodiment, the first n-channel pillar MOS transistor 610 is shorter in gate length than the second p-channel pillar MOS transistor 620. The difference in gate length between the first and second pillar MOS transistors 610 and 620 can be adjusted by selecting the conductivity type of impurities of the first and second portions 615 and 625 of the silicon film 5, and if any by adjusting the impurity concentrations of the first and second portions 615 and 625 of the silicon film 5.

The above-described first and second impurity implantation processes are carried out to get the necessary impurity concentrations for getting the desired gate heights or the desired gate lengths. The above-described third and fourth impurity implantation processes are carried out to get desired impurity concentrations for the source and drain regions. Impurity concentrations of the source and drain regions can be reduced as long as the necessary transistor driving ability and reliability can be ensured.

The method of this embodiment can be applied to processes for forming a CMOS device which includes n-channel and p-channel pillar MOS transistors with different gate lengths.

Seventh Embodiment

A method of forming a semiconductor device in accordance with a seventh embodiment will be described with reference to FIGS. 9A through 9C. The seventh embodiment provides another method of forming a semiconductor device that includes first and second pillar MOS transistors 710 and 720 which have first and second gate electrodes 715*a* and 725*a* which are different in height from each other. The first and second pillar MOS transistors 710 and 720 are different in gate length from each other.

Figure 9A:
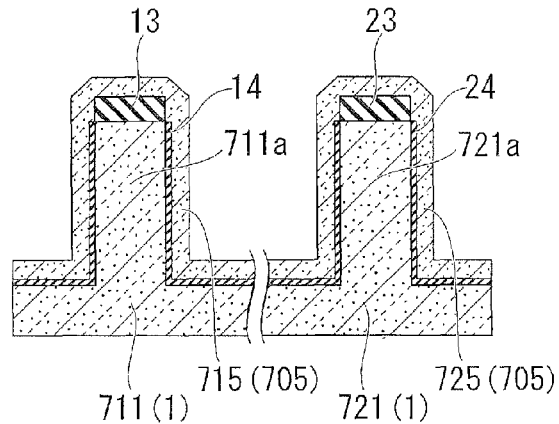
FIG. 9A is a fragmentary cross sectional elevation view illustrating a semiconductor device in a step involved in a method of forming a semiconductor device in accordance with a seventh preferred embodiment of the present invention.
Figure 9B:
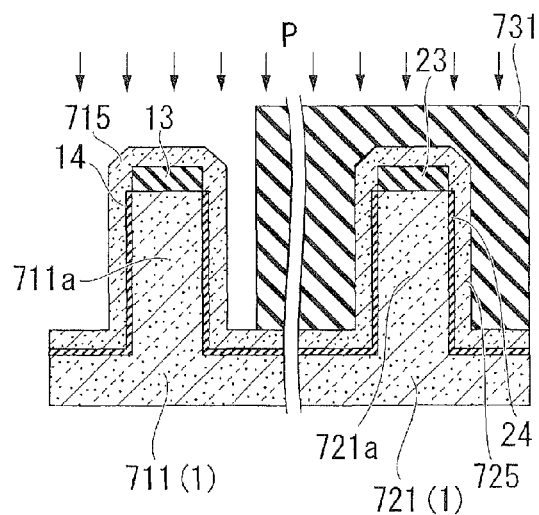
FIG. 9B is a fragmentary cross sectional elevation view illustrating a semiconductor device in a step, subsequent to the step of FIG. 9A, involved in the method of forming the semiconductor device in accordance with the seventh preferred embodiment of the present invention.
Figure 9C:
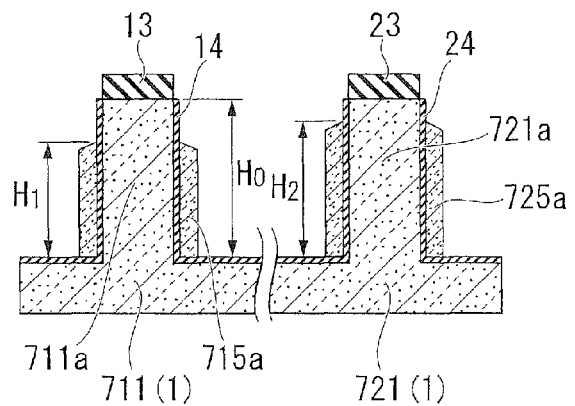
FIG. 9C is a fragmentary cross sectional elevation view illustrating a semiconductor device in a step, subsequent to the step of FIG. 9B, involved in the method of forming the semiconductor device in accordance with the seventh preferred embodiment of the present invention.

The method of forming the semiconductor device in accordance with the seventh embodiment is different from that in accordance with the first embodiment in a processes shown in FIGS. 9A through 9C. The same or similar steps involved in the method of this embodiment as those of the first embodiment will not be described again. The different steps involved in the method of this embodiment shown in FIGS. 9A through 9C is to form a gate silicon film which is in situ doped with an impurity.

First and second pillars 711a and 721a are formed in the same processes as described with reference to FIG. 3A in the first embodiment. The first and second pillars 711a and 721a extend vertically or upwardly from the surfaces of the p-well regions 711 and 721 of the silicon substrate 1. The first and second masks 713 and 723 are formed in the same processes as described with reference to FIG. 3A in the first embodiment. The gate insulating films 14 and 24 are formed in the same processes as described with reference to FIG. 3B in the first embodiment.

With reference to FIG. 9A, a gate silicon film 705 which is in situ doped with an impurity is formed in the different processes from those described with reference to FIG. 3B in the first embodiment. The gate silicon film 705 covers the first and second masks 13 and 23 and the gate insulating films 14 and 24. The gate semiconductor film 705 surrounds the first and second pillars 711a and 721a. The gate semiconductor film 705 covers the surface of the first and second p-well regions 711 and 721. The gate semiconductor film 5 may be made of non-doped silicon.

The gate semiconductor film 705 includes a first portion 715 and a second portion 725. The first portion 715 of the gate semiconductor film 705 covers the first pillar 711a. The second portion 725 of the gate semiconductor film 705 covers the second pillar 721a. The gate semiconductor film 705 is further processed so that the first portion 715 of the gate semiconductor film 705 is different in at least one of conductivity type and impurity concentration from the second portion 725 of the gate semiconductor film 705. In some cases, the first portion 715 of the gate semiconductor film 705 is n-type silicon and the second portion 725 of the gate semiconductor film 705 is non-doped silicon. In this case, the first portion 715 is higher in n-type impurity concentration than the second portion 725.

With reference to FIG. 9A, an in-situ-phosphorous-doped gate silicon film 705 is formed which covers the first and second pillars 711a and 721a. The phosphorous-doped gate silicon film 705 can be formed by a CVD method so that the phosphorous-doped gate silicon film 705 has an impurity concentration of 5E19 atoms/cm$^3$.

With reference to FIG. 9B, a resist mask 731 is formed by a lithography process. The resist mask 731 does not cover the first portion 715 of the gate semiconductor film 705, wherein the first portion 715 covers the first pillar 711a. The resist mask 731 covers the second portion 725 of the gate semiconductor film 705, wherein the second portion 725 covers the second pillar 721a. A first impurity implantation process is carried out using the resist mask 731 to selectively introduce an n-type impurity into the in-situ-phosphorous-doped first portion 715 of the gate semiconductor film 705. The first impurity implantation process can be carried out by introducing phosphorus (P) at a dose of 1E15 atoms/cm$^2$ and at energy of 10 keV. The resist mask 731 is removed. The gate semiconductor film 705 has the first portion 715 of phosphorous-doped silicon and the second portion 725 of non-doped silicon, wherein the first portion 715 covers the first pillar 711a and the second portion 725 covers the second pillar 721a.

With reference to FIG. 9C, the gate silicon film 705 is etched back by using a chlorine-based gas such as chlorine gas (Cl$_2$), thereby forming first and second gate electrodes 715a and 725a. The first gate electrode 715a surrounds the first pillar 711a. The first gate electrode 715a is separated by the gate insulating film 14 from the side face of the first pillar 711a, The second gate electrode 725a surrounds the second pillar 721a. The second gate electrode 725a is separated by the gate insulating film 24 from the side face of the second pillar 721a. The gate silicon film 705 is selectively removed. The etching back process is carried out to selectively remove removal portions of the gate silicon film 705, while leaving first and second remaining portions 715 and 725 of the gate silicon film 705. The removal portions have covered the surface of the silicon substrate 1 and the first and second masks 13 and 23. The first and second remaining portions 715 and 725 surround the first and second pillars 711a and 721a, respectively. As a result of the selective removal process, the first and second gate electrodes 715a and 725a are formed, which surround the first and second pillars 711a and 721a, respectively.

As the result of the etching process, the gate silicon film 705 is made into the first and second gate electrodes 715a and 725a which have first and second gate heights H1 and H2. In some cases, the first height H1 may be, but is not limited to, 80 nm, and the second height H2 may be, but is not limited to, 90 nm. The gate silicon film 705 was doped with an impurity such as P. The gate silicon film 705 had the first portion which is doped any impurity such as P which covers the first pillar 711a. The gate silicon film 705 had the second portion which is non-doped which covers the second pillar 721a. The first portion 715 of phosphorous-doped silicon is higher in impurity concentration than the second portion 725 of non-doped silicon. The etch back process will form the first and second gate electrodes 715a and 725a, so that the first gate electrode 715a which has the higher impurity concentration is lower in height than the second gate electrode 725a which has the lower impurity concentration. The common etch back process will form the first and second gate electrodes 715a and 725a which are different in height because the first and second gate electrodes 715a and 725a are different in impurity concentration. Namely, the difference in impurity concentration between different portions of the same semiconductor film will allow etch back process for etching back the semiconductor film to form remaining portions with different heights. The remaining portion of higher impurity concentration is lower in height than the remaining portion of lower impurity concentration. The first and second masks 13 and 23 are removed.

An ion-implantation process can be carried out to introduce an impurity of p-type into upper portions of the first and second pillars 711a and 721a, the first and second gate electrodes 715a and 725a, and the first and second p-well regions 711 and 721. The impurity may be, but is not limited to, arsenic (As$^+$) instead of boron difluoride (BF$_2$). The ion-implantation process can be carried out under the following conditions. A dose is 5E15 atoms/cm$^2$. Ion-implantation energy is 15 keV. The ion-implantation process will form first and second lower diffusion regions 716 and 726 of n-type and first and second upper diffusion regions 717 and 727 of n-type. The first and second lower diffusion regions 716 and 726 of n-type are self-aligned to the first and second gate electrodes 715a and 725a, respectively. The first and second lower diffusion regions 716 and 726 of n-type are formed in the first and second p-well regions 711 and 721, respectively. The first and second lower diffusion regions 716 and 726 of n-type are positioned near the bottoms of the first and second pillars 711a and 721a, respectively. The first and second upper diffusion regions 717 and 727 are formed at upper portions of the first and second pillars 711a and 721a, respectively. The first and second lower diffusion regions 716 and 726 of n-type serve as one of source and drain regions. The first and second upper diffusion regions 717 and 727 of n-type serves as the other of the source and drain regions. The ion-implantation can introduce arsenic into the first and second gate electrodes 715a and 725a which are phosphorous-doped and non-doped, respectively, so that the first and second gate electrodes 715a and 725a become n-type gate electrodes. A heat treatment can be carried out to activate the impurity implanted in the first and second lower diffusion regions 716 and 726 and the first and second upper diffusion regions 717 and 727. As a result, first and second pillar MOS transistors 710 and 720 of n-channel are formed over the silicon substrate 1.

The in-situ-phosphorous-doped gate silicon film 705 with the impurity concentration of $5E19$ atoms/cm$^3$ was formed which covers the first and second pillars 711a and 721a. The impurity concentration of the in-situ-phosphorous-doped gate silicon film 705 can be adjustable. In some cases, the impurity concentration of the in-situ-phosphorous-doped gate silicon film 705 may be, but is not limited to, $1E20$ atoms/cm$^3$. Increasing the impurity concentration of the in-situ-phosphorous-doped gate silicon film 705 will decrease the first and second gate lengths H1 and H2 of the first and second gate electrodes 715a and 725a. Decreasing the impurity concentration of the in-situ-phosphorous-doped gate silicon film 705 will increase the first and second gate lengths H1 and H2 of the first and second gate electrodes 715a and 725a. Adjusting the impurity concentration of the in-situ-phosphorous-doped gate silicon film 705 will adjust the first and second gate lengths H1 and H2 of the first and second gate electrodes 715a and 725a. Instead of phosphorous, other impurities may be used to form an in-situ-impurity doped silicon film. Typical examples of the other impurities may include, but are not limited to, boron and arsenic. In-situ-boron-doped gate silicon film or in-situ-arsenic-doped gate silicon film.

Eighth Embodiment

A method of forming a semiconductor device in accordance with an eighth embodiment will be described with reference to FIG. 10. The eighth embodiment provides a method of forming a semiconductor device that includes first and second pillar MOS transistors 810 and 820 which have first and second gate electrodes 15a and 25a which are different in height from each other and silicide source and drain regions. The first and second pillar MOS transistors 810 and 820 are different in gate length from each other. The first and second pillar MOS transistors 810 and 820 have the silicide source and drain regions. The first pillar MOS transistor 810 includes first lower silicide diffusion regions which include first lower diffusion regions 16a and first silicide layers 18. The first pillar MOS transistor 810 includes first upper silicide diffusion regions which include first upper diffusion regions 17a and first silicide layers 18. The second pillar MOS transistor 820 includes second lower silicide diffusion regions which include second lower diffusion regions 26a and second silicide layers 28. The second pillar MOS transistor 820 includes second upper silicide diffusion regions which include second upper diffusion regions 27a and second silicide layers 28.

Figure 10:
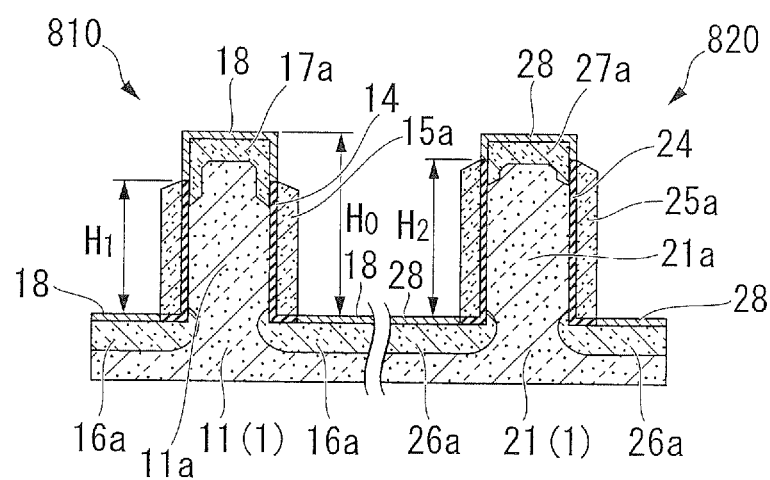
FIG. 10 is a fragmentary cross sectional elevation view illustrating a semiconductor device in a step involved in a method of forming a semiconductor device in accordance with an eighth preferred embodiment of the present invention.

The method of forming the semiconductor device in accordance with the eighth embodiment is different from that in accordance with the first embodiment in an additional process shown in FIG. 10 before forming an inter-layer insulator. The same or similar steps involved in the method of this embodiment as those of the first embodiment will not be described again. The different step involved in the method of this embodiment shown in FIG. 10 is to form silicide layers 18 and 28 on the first lower and upper diffusion regions 16a and 17a and the second lower and upper diffusion regions 26a and 27a, respectively.

With reference to FIG. 10, the gate insulating films 14 and 24 are selectively removed from the surfaces of the first lower and upper diffusion regions 16a and 17a and the surfaces of the second lower and upper diffusion regions 26a and 27a, respectively. A titanium film is formed which covers the surfaces of the first lower and upper diffusion regions 16a and 17a and the surfaces of the second lower and upper diffusion regions 26a and 27a. A heat treatment is carried out to cause silicidation reaction thereby forming first and second titanium silicide layers 18 and 28. The first titanium silicide layers 18 cover the surfaces of the first lower and upper diffusion regions 16a and 17a. The second titanium silicide layers 28 cover the surfaces of the surfaces of the second lower and upper diffusion regions 26a and 27a. The first pillar MOS transistor 810 includes first lower and upper silicide diffusion regions which include the first lower and upper diffusion regions 16a and 17a and the first silicide layers 18 covering the first lower and upper diffusion regions 16a and 17a. The second pillar MOS transistor 820 includes second lower and upper silicide diffusion regions which include the second lower and upper diffusion regions 26a and 27a and the second silicide layers 28 covering the second lower and upper diffusion regions 26a and 27a. The inter-layer insulator 41 is formed in the same process as described in the first embodiment.

The distance, which is defined from the top portion of each pillar to the top portion of a gate electrode that surrounds the pillar, will generally depend on the height H of the gate electrode. Resistance of an upper diffusion region at the top portion of the pillar which is surrounded by a gate electrode will generally depend on the height H of the gate electrode. This method of forming silicide layers can easily adjust the height H of the gate electrode to adjust the resistance of an upper diffusion region at the top portion of the pillar surrounded by a gate electrode. This method will be effective to reduce the resistance of the upper diffusion region, instead of increasing the height H of the gate electrode.

Modifications to Foregoing Embodiments

In the foregoing embodiments, the gate length or the gate height H is adjusted by adjusting the impurity concentration of the gate silicon film which is to be etched back. The impurity was boron or phosphorous. As modifications, other impurities such as indium as a p-type impurity, and arsenic or antimony as an n-type impurity may be available.

In the foregoing embodiments, the MOS transistors have silicon pillars which are surrounded by gate electrodes. In some cases, the methods described in the foregoing embodiments can be applied to other MOS transistors which have groves along which gate electrodes are formed. The methods described in the foregoing embodiments can be applied to any other MOS transistors which are formed by etching back a silicon film, as long as the etching rate is different at different portions of the silicon film because the different portions are different in at least one of conductivity type and impurity concentration.

In the foregoing embodiments, the n-channel MOS transistors have the n-type impurity doped gate electrode, and the p-channel MOS transistors have the p-type impurity doped gate electrode. As modifications, the n-channel MOS transistors may have the p-type impurity doped gate electrode, and the p-channel MOS transistors may have the n-type impurity doped gate electrode.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
   a semiconductor substrate having first and second regions;
   a first pillar transistor; and
   a second pillar transistor,
   wherein the first pillar transistor comprises a first semiconductor pillar disposed in the first region, and a first gate electrode covering a side surface of the first semiconductor pillar,
   wherein the second pillar transistor comprises a second semiconductor pillar disposed in the second region, and a second gate electrode covering a side surface of the second semiconductor pillar,
   wherein the first gate electrode is different in height from the second gate electrode, and
   the first and second pillar transistors form a CMOS device.

2. The semiconductor device according to claim 1, wherein the first gate electrode is lower in height from the second gate electrode.

3. The semiconductor device according to claim 2, wherein the first pillar transistor is an n-channel MOS transistor, and the second pillar transistor is a p-channel MOS transistor.

4. The semiconductor device according to claim 3, wherein the first semiconductor pillar comprises a p-type semiconductor, and the second semiconductor pillar comprises an n-type semiconductor.

5. The semiconductor device according to claim 3, wherein the first gate electrode comprises an n-type semiconductor, and the second gate electrode comprises a p-type semiconductor.

6. The semiconductor device according to claim 4, further comprising:
   a first top diffusion layer of an n-type semiconductor disposed over the first semiconductor pillar;
   a first bottom diffusion layer of an n-type semiconductor disposed under the first semiconductor pillar;
   a second top diffusion layer of a p-type semiconductor disposed over the second semiconductor pillar; and
   a second bottom diffusion layer of a p-type semiconductor disposed under the second semiconductor pillar.

7. The semiconductor device according to claim 1, wherein the first region comprises a p-well region, and the second region comprises an n-well region.

8. The semiconductor device according to claim 1, further comprising:
   a first gate insulator disposed between the first semiconductor pillar and the first gate electrode; and
   a second gate insulator disposed between the second semiconductor pillar and the second gate electrode.

9. A semiconductor device comprising:
   a semiconductor substrate having first and second regions;
   a first pillar transistor; and
   a second pillar transistor,
   wherein the first pillar transistor comprises a first semiconductor pillar disposed in the first region, and a first gate electrode covering a side surface of the first semiconductor pillar, the first gate electrode having a first gate length,
   wherein the second pillar transistor comprises a second semiconductor pillar disposed in the second region, and a second gate electrode covering a side surface of the second semiconductor pillar, the second gate electrode having a second gate length,
   wherein the first gate length is different in height from the second gate length, and
   the first and second pillar transistors form a CMOS device.

10. The semiconductor device according to claim 9, wherein the first gate length is shorter in height from the second gate length.

11. The semiconductor device according to claim 10, wherein the first pillar transistor is an n-channel MOS transistor, and the second pillar transistor is a p-channel MOS transistor.

12. The semiconductor device according to claim 11, wherein the first semiconductor pillar comprises a p-type semiconductor, and the second semiconductor pillar comprises an n-type semiconductor.

13. The semiconductor device according to claim 11, wherein the first gate electrode comprises an n-type semiconductor, and the second gate electrode comprises a p-type semiconductor.

14. The semiconductor device according to claim 12, further comprising:
    a first top diffusion layer of an n-type semiconductor disposed over the first semiconductor pillar;
    a first bottom diffusion layer of an n-type semiconductor disposed under the first semiconductor pillar;
    a second top diffusion layer of a p-type semiconductor disposed over the second semiconductor pillar; and
    a second bottom diffusion layer of a p-type semiconductor disposed under the second semiconductor pillar.

15. The semiconductor device according to claim 9, wherein the first region comprises a p-well region, and the second region comprises an n-well region.

16. The semiconductor device according to claim 9, further comprising:
    a first gate insulator disposed between the first semiconductor pillar and the first gate electrode; and
    a second gate insulator disposed between the second semiconductor pillar and the second gate electrode.

* * * * *

UNITED STATES PATENT AND TRADEMARK OFFICE
CERTIFICATE OF CORRECTION

PATENT NO. : 8,487,362 B2  
APPLICATION NO. : 13/715692  
DATED : July 16, 2013  
INVENTOR(S) : Hiro Nishi et al.

Page 1 of 1

It is certified that error appears in the above-identified patent and that said Letters Patent is hereby corrected as shown below:

Title Page, item (71) change "Elipda Memory, Inc., Tokyo (JP)" to "Elpida Memory, Inc., Tokyo (JP)".

Signed and Sealed this
Seventeenth Day of September, 2013

Teresa Stanek Rea
*Deputy Director of the United States Patent and Trademark Office*